(12) United States Patent
Fukushima et al.

(10) Patent No.: US 6,346,436 B1
(45) Date of Patent: Feb. 12, 2002

(54) QUANTUM THIN LINE PRODUCING METHOD AND SEMICONDUCTOR DEVICE

(75) Inventors: Yasumori Fukushima, Sakurai; Tohru Ueda, Fukuyama; Kunio Kamimura, Nara-ken, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/493,627

(22) Filed: Jan. 28, 2000

(30) Foreign Application Priority Data

Jan. 28, 1999 (JP) .......................................... 11-019866

(51) Int. Cl.[7] .............................................. H01L 21/00
(52) U.S. Cl. ........................ 438/165; 438/585; 438/607; 438/962
(58) Field of Search ................................ 438/165, 585, 438/607, 488, 489, 490, 770, 197, 962

(56) References Cited

U.S. PATENT DOCUMENTS

| | | | | |
|---|---|---|---|---|
| 4,037,307 A | * | 7/1977 | Smith | 438/585 |
| 4,359,816 A | * | 11/1982 | Abbas et al. | 438/251 |
| 5,244,828 A | * | 9/1993 | Okada et al. | 438/962 |
| 5,538,910 A | * | 7/1996 | Oku | 438/172 |
| 5,612,255 A | * | 3/1997 | Chapple-Sokol et al. | 438/962 |
| 5,739,057 A | * | 4/1998 | Tiwari et al. | 438/572 |
| 6,130,142 A | * | 10/2000 | Westwater et al. | 438/478 |

FOREIGN PATENT DOCUMENTS

| | | |
|---|---|---|
| JP | 6-077180 | 3/1994 |
| JP | 8-288499 | 11/1996 |
| JP | 2000-232219 A * | 8/2000 |

OTHER PUBLICATIONS

Ishiguro et al, Japan Society of Applied Physics, spring 1996, Lecture No. 28a–PB–5 proceeding p–798 and Lecture No. 26p–ZA–12 proceeding p–64.

* cited by examiner

*Primary Examiner*—Michael Trinh
(74) *Attorney, Agent, or Firm*—Nixon & Vanderhye, P.C.

(57) ABSTRACT

A nanometer-size quantum thin line is formed on a semiconductor substrate of a Si substrate or the like by means of the general film forming technique, lithographic technique and etching technique. By opportunely using the conventional film forming technique, photolithographic technique and etching technique, a second oxide film that extends in the perpendicular direction is formed on an Si substrate. Then, by removing the second oxide film that extends in the perpendicular direction, a second nitride film located below the film and a first oxide film located below the film by etching, a groove for exposing the Si substrate is formed. Then, a Si thin line is made to epitaxially grow on the exposed portion of the Si substrate. The quantum thin line is thus formed without using any special fine processing technique. The width of the groove can be accurately controlled in nanometers by controlling the film thickness of the second oxide film that is formed by oxidizing the surface of the second nitride film.

48 Claims, 15 Drawing Sheets

QUANTUM THIN LINE PRODUCING METHOD AND SEMICONDUCTOR DEVICE

BACKGROUND OF THE INVENTION

The present invention relates to a quantum thin line producing method for forming a quantum thin line constructed of a metal or semiconductor that is minute enough to cause a quantum size effect on an insulating substrate or a semiconductor substrate via an insulating layer and to a semiconductor device employing this quantum thin line.

The large-scale integrated circuits (LSIs) that have supported the development of electronics and currently become the industrial nucleus have made great strides in terms of their performances toward larger capacity, higher speed, lower consumption of power and so on through the microstructural progress thereof. However, it is considered that the conventional device reaches the limit in terms of the principle of operation when the device size becomes 0.1 μm or smaller, and accordingly, there are conducted energetic researches on a new device based on a new principle of operation. As for this new device, there is a device having a microstructure called the nanometer-size quantum dot or quantum thin line. The nanometer-size quantum dot is energetically examined together with a variety of quantum effect devices, particularly for the application thereof to a single electron device utilizing the Coulomb blockade phenomenon. The nanometer-size quantum thin line is expected to be applied to a super high-speed transistor utilizing the quantum effect.

Particularly, in regard to the nanometer-size quantum thin line, there is carried out trial production of a semiconductor quantum device based on a new principle of operation that the degree of freedom of an electron is limited by confining the electron in a semiconductor layer having a width approximately equal to that of the electron wavelength (de Broglie wavelength) in a semiconductor crystal and a quantization phenomenon caused by this is utilized. That is, the wavelength of an electron in a semiconductor layer is about 10 nm. Therefore, it is theoretically derived that, if an electron is confined in a semiconductor thin line (quantum thin line) having a width of about 10 nm, then the electron can move in this thin line while being scarcely deviated, for the achievement of the increased mobility of the electron.

Therefore, by forming a conductive layer in which a number of quantum thin lines as described above are arranged in a plane and controlling the number of electrons inside this conductive layer by the operation of a gate electrode, there can be produced a quantum thin line transistor having a higher operating speed than the conventional transistor. By incorporating a number of quantum thin lines as described above into a laser light emitting layer, there can be obtained a high-efficiency semiconductor laser device that has a sharp spectrum and excellent high-frequency characteristics even with a small injection current.

Conventionally, as a method for forming the aforementioned quantum thin line, there have been proposed methods as disclosed in the following reference documents (1) through (3).

(1) Ishiguro, et al., Japan Society of Applied Physics, spring in 1996, Lecture No. 28a-PB-5, proceeding p-798 and Lecture No. 26p-ZA-12, proceeding p-64

FIGS. 15A through 15D are process charts showing the "Method for uniformly producing Si quantum thin line on a SIMOX (separation by implanted oxygen) substrate utilizing anisotropic etching" disclosed in the above reference document (1).

Referring to FIGS. 15A through 15D, first, as shown in FIG. 15A, silicon nitride ($Si_3N_4$) is deposited on a (100)-SIMOX substrate constructed of a silicon substrate 1, an oxide film 2 and a SOI (silicon-on insulator) film 3, and thereafter patterning is performed to form a silicon nitride film 4. Next, as shown in FIG. 15B, anisotropic etching is performed with TMAH (tetramethylammonium hydroxide) using the silicon nitride film 4 as a mask, consequently forming a. SOI film 5 having a (111) plane on a pattern edge.

Next, as shown in FIG. 15C, the (111) plane of the side wall of the SOI film 5 is selectively oxidized using the silicon nitride film 4 as a mask, consequently forming an oxide film 6. Then, as shown in FIG. 15D, the silicon nitride film 4 is removed, and thereafter anisotropic etching is performed again with TMAH using the oxide film 6 as a mask, consequently forming a Si quantum thin line 7.

The width of this Si quantum thin line 7 is determined depending on the film thickness of the SOI film 3, and practically a thin line of about 10 nm is formed. In a quantum thin line MOSFET (metal-oxide-semiconductor field-effect transistor) formed by employing the thus-formed Si quantum thin line 7 as a channel region, there is observed Coulomb blockade vibration that is the characteristic of the quantization phenomenon.

(2) Japanese Patent Laid-Open Publication No. HEI 6-77180

FIGS. 16A through 16C are process charts showing the "quantum thin line forming method utilizing thin-line-shaped etching mask by side wall method" disclosed in the above reference document (2).

Referring to FIGS. 16A through 16C, first, as shown in FIG. 16A, a resist 12 is formed by patterning on a substrate 11 of GaAs to be etched, and a $SiO_2$ film 13 having a film thickness of 50 nm is further formed on them by plasma-activated chemical vapor deposition (PCVD). Next, as shown in FIG. 16B, reactive ion etching is performed to form a side wall 14 of $SiO_2$ on both side walls of the patterned resist 12.

Finally, as shown in FIG. 16C, the resist 12 is removed, and thereafter the substrate 11 of GaAs to be etched is patterned by reactive ion etching using the $SiO_2$ side wall 14 as a mask, consequently forming a thin line made of GaAs.

(3) Japanese Patent Laid-Open Publication No. HEI 8-288499

FIGS. 17A through 17G are process charts showing the "quantum thin line forming method utilizing sticking of two Si wafers and etching mask of wall formation" disclosed in the above reference document (3).

Referring to FIGS. 17A through 17G, first, as shown in FIG. 17A, a protruding portion 22 is formed on a Si substrate 21 by dry etching. Subsequently, as shown in FIG. 17B, a SiOx-based insulating film 23 is formed so as to flatten the entire substrate. Next, as shown in FIG. 17C, the flattened substrate is entirely inverted and stuck on another Si substrate 24 with the SiOx-based insulating film 23 side put in contact with the substrate 24. Next, as shown in FIG. 17D, the Si substrate 21 is abraded by the CMP (chemical-mechanical polishing) method until the SiOx-based insulating film 23 is exposed. As a result, an island-shaped Si layer 25 of a thickness of about 10 nm is left as buried in the SiOx-based insulating film 23. Then, by forming a polysilicon layer including an impurity to a thickness of about 10 nm by the thermal CVD (chemical vapor deposition) method and thereafter performing anisotropic etching via a resist mask (not shown), there is formed a polysilicon pattern 26 where the processed end surface is positioned in the vicinity of the center of the island-shaped Si layer 25.

Next, as shown in FIG. 17E, a thermo-oxidized film (SiOx) 27 having a film thickness of 1 nm to 10 nm is formed on the Si exposed portions 25 and 26 through a thermo-oxidizing process. Next, as shown in FIG. 17F, by etching back performed, a side wall 28 is formed with the thermo-oxidized film 27 left on the processed end surface of the polysilicon pattern 26. Next, as shown in FIG. 17G, the island-shaped Si layer 25 is subjected to wet processing on condition that a selection ratio relative to the island-shaped layer 25 can be assured, consequently removing the polysilicon pattern 26. Subsequently, the island-shaped Si layer 25 is etched on condition that the selection ratio relative to SiOx that forms the side wall 28 can be assured, consequently forming a quantum thin line 29.

However, the conventional quantum thin line forming methods disclosed in the aforementioned reference documents (1) through (3) have the following problems. That is, the reference (1) is the method effective only when the substrate is made of SOI and is not applicable to the conventionally used Si substrate. The SOI substrate costs ten to twenty times the price of the Si substrate, and it is preferable to form the quantum thin line with the Si substrate in order to further reduce the cost.

Furthermore, according to the aforementioned reference (2), the side wall that determines the width of the quantum thin line is formed by CVD and reactive ion etching. However, there is the problem that the width of the quantum thin line is required to be controlled within a range of 1 nm to 10 nm and it is difficult to control the thickness of the film formed by PCVD and side wall etching within the range of 1 nm to 10 nm.

Furthermore, according to the aforementioned reference (3), there are needed two Si substrates 21 and 24 to be stuck on each other, and there is needed the special substrate forming technique of sticking the two Si substrates 21 and 24 on each other via the insulating film 23. The height of the quantum thin line 29 to be formed is determined depending on the depth when dry etching the Si substrate 21 via the resist mask. In the above case, there is a problem that it is very difficult to control the dry etching depth in nanometer size. There is another problem that the width of the quantum thin line 29 depending on the width of the side wall 28 is hardly controlled.

SUMMARY OF THE INVENTION

Accordingly, the object of the present invention is to provide a quantum thin line producing method capable of forming a nanometer-size quantum thin line with a semiconductor substrate of a Si substrate, a GaAs substrate or the like by means of the general film forming technique, lithographic technique and etching technique as well as a semiconductor device employing the quantum thin line.

In order to achieve the aforementioned object, the present invention provides a quantum thin line producing method comprising: a process for forming a first oxide film on a semiconductor substrate and forming a patterned first nitride film on the first oxide film; a process for forming a second nitride film on the first oxide film and the patterned first nitride film and forming a second oxide film by oxidizing the surface of the second nitride film; a process for forming a third nitride film on the second oxide film; a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film; a process for removing by dry etching the second oxide film that extends in a direction perpendicular to an upper surface of the semiconductor substrate and is put between the second nitride film and the third nitride film using the second nitride film and the third nitride film as a mask, consequently forming a groove; a process for removing by etching the second nitride film located under the groove and the first oxide film located under the second nitride film, consequently exposing the semiconductor substrate; a process for removing the first nitride film together with the second nitride film and the third nitride film facing the groove; a process for epitaxially growing a quantum thin line on the exposed portion of the semiconductor substrate; a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

According to the above construction, the groove for exposing the semiconductor substrate that becomes the portion where the quantum thin line is epitaxially grown is formed by the general film forming technique, lithographic technique and etching technique. Therefore, the positional control of the quantum thin line can be enabled. The width of the groove for determining the width of the quantum thin line is determined depending on the film thickness of the second oxide film formed by oxidizing the surface of the second nitride film. Therefore, the width of the quantum thin line is accurately controlled. Furthermore, the quantum thin line is formed through epitaxial growth, and therefore, a quantum thin line having excellent crystallinity and good uniformity of size and density is formed with good reproducibility. Since the quantum thin line is made to epitaxially grow on the exposed portion of the semiconductor substrate, the quantum thin line can be formed by using the semiconductor substrate of the Si substrate that has conventionally been used. In the above case, the width of the groove where the quantum thin line grows is determined depending on the film thickness of the second oxide film formed by oxidizing the surface of the second nitride film. Therefore, the width can be controlled in nanometer size, and accordingly the width of the quantum thin line can be set in nanometer size. Furthermore, after the growth of the quantum thin line, oxidation is performed to isolate the quantum thin line from the semiconductor substrate by the third oxide film. Therefore, the bottom surface side of the quantum thin line is not put in contact with the semiconductor substrate, allowing the electron to be completely confined. Since one semiconductor substrate is used, there is not needed the special substrate forming technique of sticking two Si substrates on each other via the insulating layer, and the quantum thin line can be easily formed at low cost.

As described above, there is provided a quantum thin line producing method of a high yield and high productivity appropriate for mass production at reduced producing cost without using any special fine processing technique.

According to the present invention, there is provided a quantum thin line producing method comprising: a process for forming a first oxide film on a semiconductor substrate and forming a patterned first nitride film on the first oxide film; a process for forming a second nitride film on the first oxide film and the patterned first nitride film and forming a second oxide film by oxidizing the surface of the second nitride film; a process for forming a third nitride film on the second oxide film; a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film; a process for forming a fourth nitride film; a process for etching back the fourth nitride film, consequently exposing a portion that belongs to the second oxide film and is located above the first nitride film; a process for removing by dry etching the second oxide film that extends in a direction perpendicular to an upper surface of the semiconductor substrate and is put between the second nitride film and the third nitride film using the second nitride film, the third nitride film and the fourth nitride film as a mask, consequently forming a groove; a process for removing by etching the second nitride film located under the groove and the first oxide film located under the second nitride film, consequently exposing the semiconductor substrate; a process for removing the first nitride film together with the second nitride film, the third nitride film and the fourth nitride film facing the groove; a process for epitaxially growing a quantum thin line on the exposed portion of the semiconductor substrate; a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

According to the above construction, the third nitride film is etched back to expose the second oxide film on the first nitride film, and thereafter the fourth nitride film is formed. With this arrangement, even if the second oxide film located between the first nitride film patterns and the mask is disadvantageously exposed due to the wide interval between the edge of the mask for etching back use and the edge of the first nitride film when etching back the third nitride film, then the portion is covered with the fourth nitride film. Thus, the positional control margin of the end surface of the mask is about doubled, and this improves the workability and accuracy of the positional control.

According to the present invention, there is provided a quantum thin line producing method comprising: a process for forming a first oxide film on a semiconductor substrate and forming a patterned first nitride film on the first oxide film; a process for forming a second nitride film on the first oxide film and the patterned first nitride film and forming a second oxide film by oxidizing the surface of the second nitride film; a process for forming a third nitride film on the second oxide film; a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film; a process for forming a fourth nitride film; a process for etching back the fourth nitride film, consequently exposing a portion that belongs to the second oxide film and is located above the first nitride film; a process for removing the second oxide film and the second nitride film located above the first nitride film; a process for reducing by etching back the first nitride film, the third nitride film and the fourth nitride film in film thickness and lowering in height the second nitride film that extends in the direction perpendicular to an upper surface of the semiconductor substrate; a process for removing by dry etching the second oxide film that extends in a direction perpendicular to the upper surface of the semiconductor substrate and is put between the second nitride film and the third nitride film using the second nitride film, the third nitride film and the fourth nitride film as a mask, consequently forming a groove; a process for removing by etching the second nitride film located under the groove and the first oxide film located under the second nitride film, consequently exposing the semiconductor substrate; a process for removing the first nitride film together with the second nitride film, the third nitride film and the fourth nitride film facing the groove; a process for epitaxially growing a quantum thin line on the exposed portion of the semiconductor substrate; a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

According to the above construction, the fourth nitride film is etched back to expose and remove the second oxide film on the first nitride film, and thereafter the first, third and fourth nitride films are etched back, as a consequence of which only the second oxide film extending in the perpendicular direction protrudes from the surface. The aspect ratio of etching relative to the perpendicular second oxide film is thus reduced, allowing the groove for exposing the semiconductor substrate to be easily formed.

According to the present invention, there is provided a quantum thin line producing method comprising: a process for forming a first oxide film on a semiconductor substrate and forming a patterned first nitride film on the first oxide film; a process for forming a second oxide film on the first oxide film and the patterned first nitride film; a process for forming a second nitride film on the second oxide film; a process for masking a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film; a process for removing by dry etching the second oxide film that extends in a direction perpendicular to an upper surface of the semiconductor substrate and is put between the first nitride film and the second nitride film together with the first oxide film located under the second oxide film using the first nitride film and the second nitride film as a mask, consequently forming a groove for exposing the semiconductor substrate; process for epitaxially growing a quantum thin line on the exposed portion of the semiconductor substrate; a process for removing the first oxide film and the second oxide film; and a process for forming a third oxide film by oxidizing a lower portion of the quantum thin line, consequently isolating the quantum thin line from the semiconductor substrate by the third oxide film.

According to the above construction, the groove obtained by exposing the semiconductor substrate is formed by the general film forming technique, lithographic technique and etching technique. Therefore, the positional control of the quantum thin line is enabled. Furthermore, the width of the groove for determining the width of the quantum thin line is set by the film thickness of the second oxide film, and therefore, the width of the quantum thin line is accurately controlled. The quantum thin line is formed through epitaxial growth, a quantum thin line having excellent crystallinity and good uniformity of size and density is formed with good reproducibility. Furthermore, the second oxide film is formed without oxidizing the nitride film, and therefore, the processes are reduced for simplification by the nitride film forming process for forming the second oxide film.

According to the present invention, there is provided a quantum thin line producing method comprising: a process for forming a first oxide film on a semiconductor substrate and forming a patterned first nitride film on the first oxide film; a process for forming a second oxide film on the first oxide film and the patterned first nitride film; a process for forming a second nitride film on the second oxide film; a process for masking a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film; a process for forming. a third nitride film; a process for etching back the third nitride film, consequently exposing a portion that belongs to the second oxide film and is located above the first nitride film; a process for removing by dry etching the second oxide film that extends in a direction perpendicular to an upper surface of the semiconductor substrate and is put between the first nitride film and the second nitride film together with the first oxide film located under the second oxide film using the first nitride film, the second nitride film and the third nitride film as a mask, consequently forming a groove for exposing the semiconductor substrate; a process for removing the first nitride film, the second nitride film and the third nitride film; a process for epitaxially growing a quantum thin line on the exposed portion of the semiconductor substrate; a process for removing the first oxide film and the second oxide film; and a process for forming a third oxide film by oxidizing a lower portion of the quantum thin line, consequently isolating the quantum thin line from the semiconductor substrate by the third oxide film.

According to the above construction, the second nitride film is etched back to expose the second oxide film on the first nitride film, and thereafter the third nitride film is formed. With this arrangement, even if the second oxide film located between the first nitride film patterns and the mask is disadvantageously exposed due to the wide interval between the edge of the mask for etching back use and the edge of the first nitride film when etching back the second nitride film, then the portion is covered with the third nitride film. Thus, the positional control margin of the end surface of the mask is about doubled, and this improves the workability and -accuracy of the positional control.

According to the present invention, there is provided a quantum thin line producing method comprising: a process for forming a first oxide film on a semiconductor substrate and forming a patterned first nitride film on the first oxide film; a process for forming a second oxide film on the first oxide film and the patterned first nitride film; a process for forming a second nitride film on the second oxide film; a process for masking -a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film; a process for forming a third nitride film; a process for etching back the third nitride film, consequently exposing a portion that belongs to the second oxide film and is located above the first nitride film; a process for removing the second oxide film located above the first nitride film; a process for reducing the first nitride film, the second nitride film and the third nitride film in film thickness; a process for removing by dry etching the second oxide film that extends in a direction perpendicular to an upper surface of the semiconductor substrate and is put between the first nitride film and the second nitride film together with the first oxide film located under the second oxide film using the first nitride film, the second nitride film and the third nitride film as a mask, consequently forming a groove for exposing the semiconductor substrate; a process for removing the first nitride film, the second nitride film and the third nitride film; a process for epitaxially growing a quantum thin line on the exposed portion of the semiconductor substrate; a process for removing the first oxide film and the second oxide film; and a process for forming a third oxide film by oxidizing a lower portion of the quantum thin line, consequently isolating the quantum thin line from the semiconductor substrate by the third oxide film.

According to the above construction, the third nitride film is etched back to expose and remove the second oxide film on the first nitride film, and thereafter the first, second and third nitride films are etched back, as a consequence of which only the second oxide film extending in the perpendicular direction protrudes from the surface. The aspect ratio of etching relative to the perpendicular second oxide film is thus reduced, allowing the groove for exposing the semiconductor substrate to be easily formed.

According to the present invention, there is provided a quantum thin line producing method comprising: a process for forming a first oxide film on a semiconductor substrate and forming a patterned first nitride film on the first oxide film; a process for forming a second nitride film on the first oxide film and the patterned first nitride film and forming a second oxide film by oxidizing the surface of the second nitride film; a process for forming a third nitride film on the second oxide film, consequently burying a recess portion located between portions of the first nitride film; a process for etching back the third nitride film, consequently exposing a portion that belongs to the second oxide film and is located above the first nitride film; a process for removing by etching the second oxide film that extends in a direction perpendicular to an upper surface of the semiconductor substrate and is put between the second nitride film and the third nitride film using the second nitride film and the third nitride film as a mask, consequently forming a groove; a process for removing by etching the second nitride film located under the groove and the first oxide film located under the second nitride film, consequently exposing the semiconductor substrate; a process for removing the first nitride film together with the second nitride film and the third nitride film facing the groove; a process for epitaxially growing a quantum thin line on the exposed portion of the semiconductor substrate; a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

According to the above construction, the space between the adjacent first nitride film patterns is buried under the third nitride film, and this third nitride film is etched back to expose the second oxide film on the -first nitride film. In this case, if the interval between the adjacent first nitride film portions is narrow to a certain extent, then the third nitride film is left between both the first nitride film portions. Therefore, the mask for etching back the third nitride film is not needed, and this simplifies the processes and reduces the producing cost.

According to the present invention, there is provided a quantum thin line producing method comprising: a process for forming a first oxide film on a semiconductor substrate and forming a patterned first nitride film on the first oxide film; a process for forming a second oxide film on the first oxide film and the patterned first nitride film; a process for forming a second nitride film on the second oxide film, consequently burying a recess portion located between portions of the first nitride film; a process for etching back the second nitride film, consequently exposing a portion that belongs to the second oxide film and is located above the first nitride film; a process for removing by etching the second oxide film that extends in a direction perpendicular to an upper surface of the semiconductor substrate and is put between the first nitride film and the second nitride film together with the first oxide film located tinder the second oxide film using the first nitride film and the second nitride film as a mask, consequently forming a groove for exposing the semiconductor substrate; a process for removing first nitride film and the second nitride film; a process for epitaxially growing a quantum thin line on the exposed portion of the semiconductor substrate; a process for removing the first oxide film and the second oxide film; and a process for forming a third oxide film by oxidizing a lower portion of the quantum thin line, consequently isolating the quantum thin line from the semiconductor substrate by the third oxide film.

According to the above construction, the space between the adjacent first nitride film patterns is buried under the second nitride film, and this second nitride film is etched back to expose the second oxide film on the first nitride film. In this case, if the interval between the adjacent first nitride film portions is narrow to a certain extent, then the second nitride film is left between both the first nitride film portions. Therefore, the mask for etching back the second nitride film is not needed, and this simplifies the processes and reduces the producing cost. Furthermore, the second oxide film is formed without oxidizing the nitride film, and therefore, the processes are reduced for simplification by the nitride film forming process for forming the second oxide film.

In one embodiment, there is provided a quantum thin line producing method, wherein the process for epitaxially growing the quantum thin line comprises the steps of: introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

According to the above embodiment, the atmospheric components and the impurities of moisture component and the like are discharged so that the reaction chamber comes to have a high vacuum of not higher than $10^{-6}$ Torr, consequently promoting the epitaxial growth in the highly clean environment. Then, during the epitaxial growth, the material gas partial pressure is controlled under a pressure of not higher than $10^{-2}$ Torr, and this prevents the rapid start of film growth on the entire surface of the insulating thin film and allows the selective vapor growth of the quantum thin line only in the groove obtained by exposing the semiconductor substrate. Thus, the degree of vacuum inside the reaction chamber, the amount of material gas to be introduced, the time of introduction, the substrate temperature and so on are controlled by means of a general high-vacuum CVD apparatus, by which the quantum thin line of the desired size is formed with high reproducibility.

In one embodiment, a silicon thin line is formed as the quantum thin line using any one of monosilane ($SiH_4$), disilane ($Si_2H_6$), trisilane ($Si_3H.$), dichlorosilane ($SiH_2Cl_2$) and tetrachlorosilane ($SiCl_4$) as a material gas.

According to the above embodiment, a quantum thin line made of silicon is formed by using any one of $SiH_4$, $Si_2H_6$, $Si_3H_8$, $SiH_2Cl_2$ and $Si_4$ as the reaction gas, by which the uniformity of size and the reproducibility of the quantum thin line are further improved.

In one embodiment, a germanium thin line is formed as the quantum thin line using any one of monogermane ($GeH_4$), digermane ($Ge_2H_6$) and germanium tetrafluoride ($GeF_4$) as a material gas.

According to the above embodiment, a quantum thin line made of germanium is formed by using any one of $GeH_4$, $Ge_2H_6$ and $GeF_4$ as the reaction gas, by which the uniformity of size and the reproducibility of the quantum thin line are further improved.

In one embodiment, a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeF_4$), digermane ($Ge_2H_6$) and germanium tetrafluoride ($GeF_4$) as a material gas.

According to the above embodiment, a quantum thin line made of silicon germanium is formed by using a mixed gas of any one of $SiH_4$, $Si_2H_6$, $Si_3H_8$, $SiH_2Cl_2$ and $SiCl_4$ and any one of $GeH_4$, $Ge_2H_6$ and $GeF_4$ as the reaction gas, by which the uniformity of size and the reproducibility of the quantum thin line are further improved.

In one embodiment, an aluminum thin line is formed as the quantum thin line using an organic aluminum.

According to the above embodiment, a quantum thin line made of aluminum is formed by using an organic aluminum of dimethyl aluminum hydride (DMAH: $(CH_3)_2AlH$) or the like as a material, by which the uniformity of size and the reproducibility of the quantum thin line are further improved.

According to the present invention, there is provided a semiconductor device having a source region, a drain region, a channel region located between the source region and the drain region, a gate region for controlling a channel current flowing through the channel region, a floating gate region located between the gate region and the channel region, a first insulating film located between the floating gate region and the gate region and a second insulating film located between the channel region and the floating gate region, the floating gate region being comprised of a quantum thin line formed by the quantum thin line producing method.

According to the above construction, the quantum thin line is used as the floating gate region of the transistor, by which the electric charge accumulation is reduced and the amount of electric charges to be injected Iinto the floating gate region is reduced. This enables the obtainment of a non-volatile memory of a small consumption of power, a high density and a large capacity. Furthermore, the quantum thin line can be formed by the general film forming technique, lithographic technique and etching technique. Therefore, a non-volatile memory of a high yield and high productivity appropriate for mass production can be obtained at low cost. Furthermore, the non-volatile memory having the quantum thin line that becomes the basis of the single electron device can be mounted on the same substrate as that of a Si-based LSI.

According to the present invention, there is provided a semiconductor device having a source region, a drain region, a channel region located between the source region and the drain region, a gate region for controlling a channel current flowing through the channel region and a gate insulating film located between the channel region and the gate region, the channel region being comprised of a quantum thin line formed by the above quantum thin line producing method.

According to the above construction, the channel region of the transistor is constructed of the quantum thin line, by which the channel region is quantized in the id direction perpendicular to the lengthwise direction, exhibiting linear conduction. As a result, a super-high speed operation is enabled, allowing a transistor of a high yield and high productivity appropriate for mass production to be obtained at low cost. Furthermore, the transistor having the quantum thin line that becomes the basis of the single electron device can be mounted on the same substrate as that of a Si-based LSI.

According to the present invention, there is provided a semiconductor device comprising: a quantum thin line formed by the above quantum thin line producing method; a first insulating film and a second insulating film laminated with interposition of the quantum thin line; a first electrode formed on the first insulating film; and a second electrode formed on the second insulating film, whereby the quantum thin line emits light when a voltage is applied across the first electrode and the second electrode.

According to the above construction, by virtue of the quantum confining effect produced by putting the quantum thin line between the insulating film portions and further between the electrodes, the quantum thin line has a direct transition type band structure. Therefore, by making a tunnel current flow with a voltage applied across both the electrodes so as to inject electrons into the quantum thin line, electron transition occurs in the quantum thin line, causing light emission. Thus, a high-efficiency light-emitting-device of excellent high-frequency characteristics having a sharp spectrum even with a small injection current can be obtained at low cost with a high yield and high productivity. Furthermore, the semiconductor device having the quantum thin line that becomes the basis of the quantum effect device or the single electron device can be mounted on the same substrate as that of the Si-based LSI. By applying this semiconductor device to a light-emitting device or a photoelectric transducing device, an electronic circuit and an optical communication circuit can be combined with each other.

According to the present invention, there is provided a semiconductor device comprising: a quantum thin line formed by the above quantum thin line producing method; an n-type impurity region formed in a portion of the quantum thin line; and a p-type impurity region formed in contact with the n-type impurity region on the quantum thin line, whereby a junction region of both the impurity regions of the quantum thin line emits light when a voltage is applied across the n-type impurity region and the p-type impurity region.

According to the above construction, a pn junction is formed of the n-type impurity region and the p-type impurity region in the quantum thin line, where the direct transition type band structure is provided by the quantum confining effect. Therefore, by applying a voltage to the n-type impurity region and the p-type impurity region, reunion of an electron with a hole occurs in the pn junction portion, consequently emitting light. Thus, a high-efficiency light-emitting device of excellent high-frequency characteristics having a sharp spectrum even with a small injection current can be obtained at low cost with a high yield and high productivity. Furthermore, the semiconductor device having the quantum thin line that becomes the basis of the quantum effect device or the single electron device can be mounted on the same substrate as that of the Si-based LSI. By applying this semiconductor device to a light-emitting device or a photoelectric transducing device, an electronic circuit and an optical communication circuit can be combined with each other.

According to the present invention, there is provided a semiconductor device having a quantum thin line formed by the above quantum thin line producing method, wherein a forbidden bandwidth of a first region of the quantum thin line is made smaller than a forbidden bandwidth of two second regions positioned on both sides of the first region, and the first region emits light when a voltage is applied across both the second regions.

According to the above construction, the quantum thin line has the direct transition type band structure by the quantum confining effect. Due to the fact that the forbidden bandwidth of the first region located in the center portion is smaller than the forbidden bandwidth of the second regions located on both sides, a double hetero structure in which the efficiency of reunion of an electron with a hole is high is provided. Therefore, by applying a voltage to the two second regions located on both sides of the first region, the reunion of an electron with a hole occurs in the second region, consequently emitting light. Thus, a high-efficiency light-emitting device or an optical transducing device of excellent high-frequency characteristics having a sharp spectrum even with a small injection current can be obtained at low cost with a high yield and high productivity. Furthermore, the semiconductor device having the quantum thin line that becomes the basis of the quantum effect device or the single electron device can be mounted on the same substrate as that of the Si-based LSI. By applying this semiconductor device to a light-emitting device or a photoelectric transducing device, an electronic circuit and an optical communication circuit can be combined with each other.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
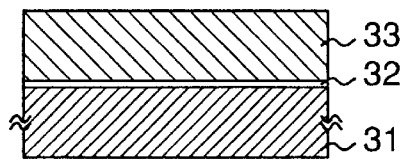
FIGS. 1A through 1K are sectional views of a substrate, showing a quantum thin line producing method according to the present invention.

The present invention will be described in detail below on the basis of the embodiments shown in the drawings.

First Embodiment

FIGS. 1A through 1K are sectional views of a substrate in the processing stages of the quantum thin line producing method of the present embodiment. Referring to FIGS. 1A through 1K, first, as shown in FIG. 1A, a surface of a silicon substrate 31 is oxidized to form a first oxide film 32 having a film thickness of 10 nm, and subsequently a first nitride film 33 having a film thickness of 100 nm is formed by the CVD method or the like. In this case, the first nitride film 33 has a sufficient film thickness with respect to positional alignment accuracy in forming a photoresist pattern 37 for patterning a third nitride film 36 in the subsequent process.

Figure 1B:
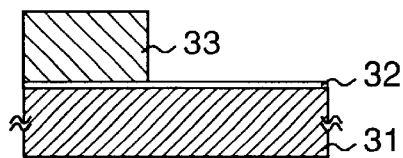
Figure 1C:
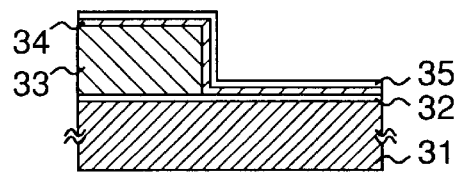
Figure 1D:
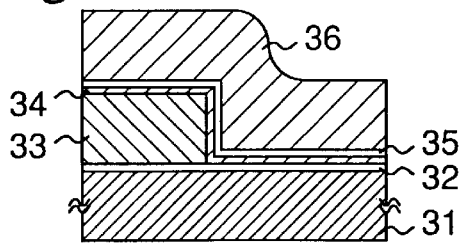

Next, as shown in FIG. 1B, the first nitride film 33 is patterned by anisotropic etching via a resist mask (not shown). Next, as shown in FIG. 1C, a second nitride film 34 having a film thickness of 10 nm is formed by the CVD method or the like. Subsequently, the surface of the second nitride film 34 is oxidized to form a second oxide film 35 having a film thickness of 5 nm. Next, as shown in FIG. 1D, a third nitride film 36 having a film thickness of 100 nm is formed by the CVD method or the like.

Figure 1E:
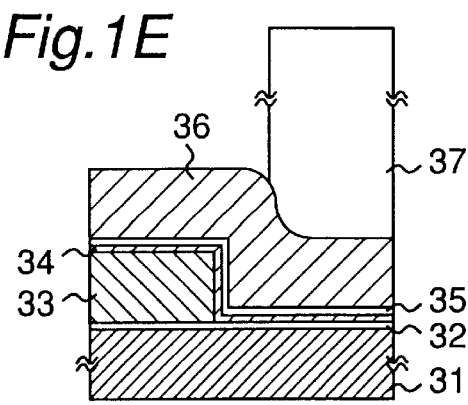

Next, as shown in FIG. 1E, a photoresist pattern 37 is formed so that its end surface is positioned in a stepped portion of the third nitride film 36. In this case, as described hereinabove, the film thickness of the first nitride film 33 is set thick so as to allow the end surface of the photoresist pattern 37 to be positioned in the stepped portion of the third nitride film 36 by using the positional alignment accuracy of the photoresist pattern end surface by the conventional LSI technique. Therefore, the resist pattern 37 can be formed by the conventional LSI exposure technique without using any special exposure technique by means of electron beam lithography, AFM (atomic force microscope) or the like.

Figure 1F:
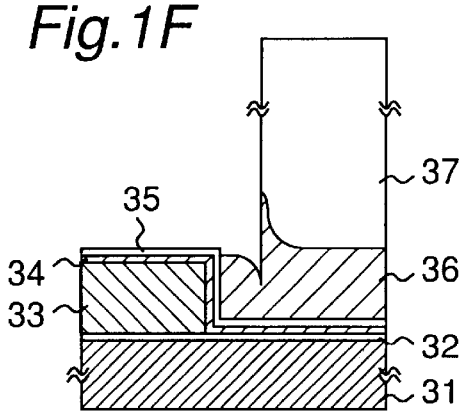

Next, as shown in FIG. 1F, the portion that belongs to the third nitride film 36 and is located above the first nitride film 33 is removed by anisotropic etching using the resist pattern 37 as a mask. In this case, the portion that belongs to the third nitride film 36 and is located below the photoresist pattern 37 is left intact without being etched, as a consequence of which the third nitride film 36 located between the photoresist pattern 37 and the first nitride film 33 comes to have a shape like a side wall. The end surface of the photoresist pattern 37 is positioned in the vicinity of the stepped portion (see FIG. 1D) of the third nitride film 36, and therefore, the most deeply etched portion of the shape like the above-mentioned side wall does not reach the second oxide film 35 located below the third nitride film 36.

Figure 1G:
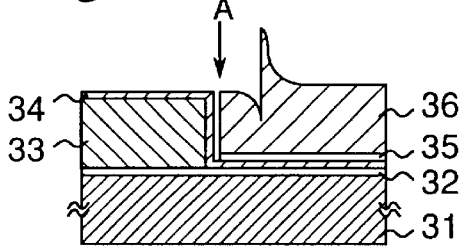
Figure 1H:
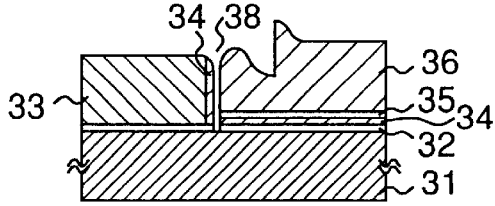

Next, as shown in FIG. 1G, the photoresist pattern 37 is removed and thereafter the oxide film is subjected to dry etching. By this dry etching, the portion that is belonging to the second oxide film 35, existing on the first nitride film 33, extending in the direction perpendicular to the silicon substrate 31 and put between the second nitride film 34 and the third nitride film 36 is removed. Next, as shown in FIG. 1H, by etching a second nitride film 34 located under a groove A formed by removing the second oxide film 35 extending in the perpendicular direction by the dry etching of the oxide film in FIG. 1G and a first oxide film 32 located under the second nitride film 34, a groove 38 for exposing the silicon substrate 31 is formed. That is, the width of the groove 38 is set by the film thickness (5 nm) of the second oxide film 35.

Figure 1I:
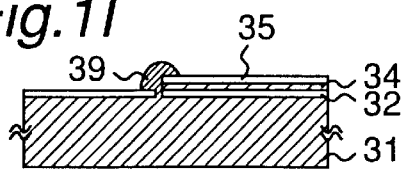

Next, as shown in FIG. 1I, the first nitride film 33, the second nitride film 34 and the third nitride film 36 that extend in the perpendicular direction are removed by dry etching or wet etching. Subsequently, the entire substrate is placed in a reaction chamber equivalent to a high-vacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas becomes $10^{-2}$ Torr or lower, the Si thin line 39 is made to epitaxially grow on the exposed portion of the Si substrate 31. In this case, it is required to subsequently isolate the Si thin line 39 from the Si substrate 31 through oxidation, and therefore, the Si thin line 39 is made to grow wider than the width of the groove 38. In this case, during the epitaxial growth process, the partial pressure of the material gas is set to $10^{-2}$ Torr or lower. This prevents the rapid start of film growth on the entire surface of the insulating thin film and subjects the Si thin line 39 to selective gaseous phase growth only on the groove 38 obtained by exposing the Si substrate 31.

In order to eliminate the damage due to the etching of the exposed portion of the Si substrate 31 prior to the epitaxial growth of the Si thin line 39, it is acceptable to form a sacrifice oxide film on the surface of the exposed portion of the Si substrate 31 and perform wet etching for an appropriate time. The evacuation of the reaction chamber is not limited to $10^{-8}$ Torr but permitted to be not higher than $10^{-6}$ Torr.

Figure 1J:
Figure 1K:
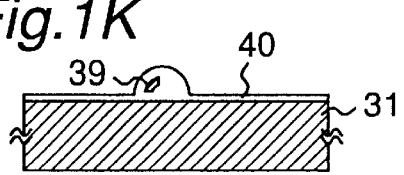

Next, as shown in FIG. 1J, the first oxide film 32, the second nitride film 34 and the second oxide film 35 are removed by wet etching with hydrofluoric acid, phosphoric acid or the like. Finally, as shown in FIG. 1K, oxidation is performed to form a third oxide film 40 below the Si thin line 39 and on the surface of the Si substrate 31. The Si thin line 39 and the Si substrate 31 are thus isolated from each other by the third oxide film 40, consequently forming the Si thin line 39.

As described above, in the present embodiment, by opportunely using the normal film forming technique, photolithographic technique and etching technique, the second oxide film 35 that is put between the first nitride film 33 and the laminate body of the second nitride film 34, the second oxide film 35 and the third nitride film 36 and extends in the direction perpendicular to the upper surface of the Si substrate 31 is formed on the Si substrate 31 via the first oxide film 32. Then, by removing the second oxide film 35 that extends in the perpendicular direction, the second nitride film 34 located under the second oxide film 35 and the first oxide film 32 located under the second nitride film 34 by etching, the groove 38 for exposing the Si substrate 31 is formed. Subsequently, the first nitride film 33, the second nitride film 34 that extends in the perpendicular direction and the third nitride film 36 are removed, and the Si thin line 39 is made to epitaxially grow on the exposed portion of the Si substrate 31 located between the first oxide film 32 and the laminate body of the first oxide film 32, the second nitride film 34 and the second oxide film 35. Then, the first oxide film 32, the second nitride film 34 and the second oxide film 35 are removed, and the Si thin line 39 and the Si substrate 31 are isolated from each other by the third oxide film 40 formed through oxidation, consequently forming the quantum thin line 39.

Therefore, according to the present embodiment, the width of the quantum thin line 39 can be determined by the width of the groove 38 that extends in the direction perpendicular to the upper surface of the Si substrate 31 and exposes the Si substrate 31, i.e., the film thickness of the second oxide film 35 obtained by oxidizing the second nitride film 34. Then, the groove 38 can be formed by the normal film forming technique, lithographic technique and etching technique. Therefore, the quantum thin line 39 can be formed without using any special fine processing technique. That is, according to the present embodiment, a quantum thin line producing method that is able to reduce the producing cost and assure a high yield and is appropriate for mass-production can be achieved.

In the above case, the width of the groove 38 can be controlled by controlling the film thickness of the second oxide film 35 formed by oxidizing the surface of the second nitride film 34. Therefore, the width of the groove 38, i.e., the width of the quantum thin line 39 can be accurately controlled in nanometers, and this allows the obtainment of the quantum thin line 39 having a complete electron confining region. Furthermore, the Si thin line 39 is formed by epitaxial growth on the exposed portion of the Si substrate 31 inside the groove 38, and therefore, a quantum thin line 39 having satisfactory uniformity of size and density and reproducibility can be formed. Furthermore, by virtue of the isolation of the Si thin line 39 from the Si substrate 31 by the third oxide film 40, the bottom surface side of the quantum thin line 39 is not put in contact with the Si substrate 31, allowing the electron to be completely confined.

Second Embodiment

In the first embodiment, the end surface of the photoresist pattern 37 for patterning the third nitride film 36 is required to be positioned in the stepped portion of the third nitride film 36. That is, in FIG. 2A, the end surface of a photoresist pattern 47 is required to be placed inside the positional control margin "a" of the photoresist pattern end surface. Therefore, in the first embodiment, the film thickness of the first nitride film 33 is made sufficiently thick by utilizing the positional alignment accuracy of the photoresist pattern end surface according to the normal LSI technique so that the photoresist pattern end surface can be positioned within the positional control margin "a". According to the present embodiment, the positional control margin of the end surface of the photoresist pattern 47 is made about double that of the first embodiment.

In the present embodiment, first, similarly to FIG. 1A through FIG. 1E of the first embodiment, a first oxide film (10 nm) 42, a first nitride film (100 nm) pattern 43, a second nitride film (10 nm) 44, a second oxide film (5 nm) 45 and a third nitride film (100 nm) 46 are formed on an Si substrate 41. Further, the photoresist pattern 47 is formed so that the end surface thereof is positioned in the stepped portion of the third nitride film 46. Thus, the state of FIG. 2A is provided.

Figure 2A:
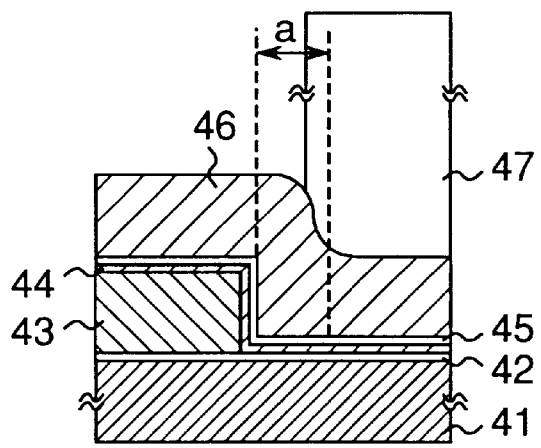
FIGS. 2A through 2E are sectional views of a substrate, showing a quantum thin line producing method different from that of FIGS. 1A–1K.
Figure 2D:
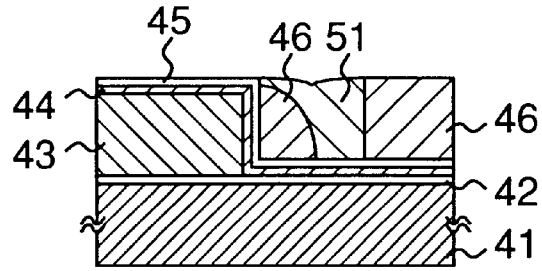
Figure 2B:
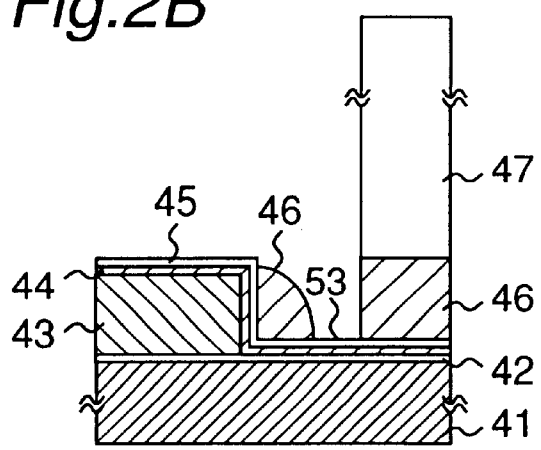

If the end surface of the photoresist pattern 47 is formed on the right-hand side of the positional control margin "a" shown in FIG. 2A and dry etching is performed using the photoresist pattern 47 as a mask for patterning the third nitride film 46, then, as shown in FIG. 2B, the most deeply etched portion of the shape like the aforementioned side wall reaches the second oxide film 45 and a second oxide film exposed portion 53 where the second oxide film 45 is exposed is formed outside the first nitride film pattern 43. Therefore, if the processes subsequent to the process of FIG. 1G are performed strictly in accordance with the first embodiment, then an exposed portion of the Si substrate 41 is disadvantageously formed in the second oxide film exposed portion 53.

Figure 2E:
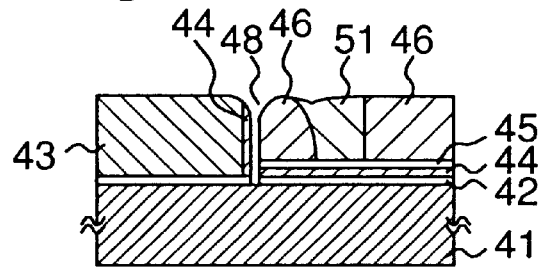
Figure 2C:
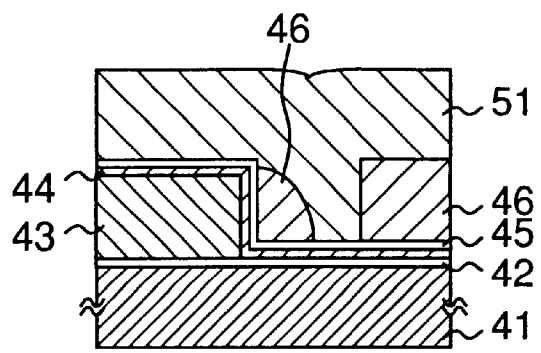

Accordingly, in the present embodiment, as shown in FIG. 2C, a fourth nitride film 51 having a film thickness of 100 nm is formed after the removal of the photoresist pattern 47. In this case, by appropriately changing the film thickness of the fourth nitride film 51 according to the width of the second oxide film exposed portion 53, the surface unevenness after the formation of the fourth nitride film 51 can be reduced. Next, as shown in FIG. 2D, the fourth nitride film 51 is etched back so that the portion that belongs to the second oxide film 45 and is located above the first nitride film 43 is exposed. Then, by performing the dry etching of the oxide film, as shown in FIG. 2E, the portion that is belonging to the second oxide film 45, existing on the first nitride film 43, extending in the direction perpendicular to the Si substrate 41 and put between the second nitride film 44 and the third nitride film 46 is removed. Subsequently, by etching the second nitride film 44 located under a groove 48 formed by removing the second oxide film 45 that extends in the perpendicular direction by the dry etching of the oxide film and etching the first oxide film 42 located under the second nitride film 44, the groove 48 for exposing the Si substrate 41 is formed. By performing the subsequent processes similarly to the processes of FIG. 1I through FIG. 1K, a Si quantum thin line can be formed.

According to this second embodiment, if the distance between the end surface of the first nitride film 43 and the end surface of the photoresist pattern 47 exceeds the aforementioned positional control margin "a" and the second oxide film exposed portion 53 is formed outside the first nitride film pattern 43, then the portion 53 can be covered with the fourth nitride film 51. Therefore, the positional control margin "a" of the end surface of the photoresist pattern 47 can be made about double that of the first embodiment, allowing the workability and accuracy of positional control to be improved.

Third Embodiment

In the aforementioned second embodiment, as shown in FIG. 2E, the groove 48 for exposing the Si substrate 41 is formed by performing oxide film etching and nitride film etching and oxide film etching. However, it is anticipated that the aspect ratio of the groove 48 for exposing the Si substrate 41 will become very large, and it can be considered very difficult to form a narrow groove 48 by etching in the above case. Accordingly, in the present embodiment, the aspect ratio of the groove to be formed for exposing the Si substrate is reduced to allow the formation of the groove by etching to be easy.

Figure 3A:
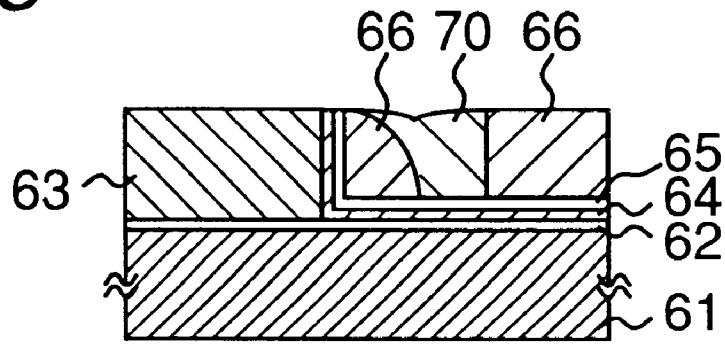
FIGS. 3A through 3C are sectional views of a substrate, showing a quantum thin line producing method different from those of FIGS. 1A–1K and FIGS. 2A–2E.
Figure 3B:
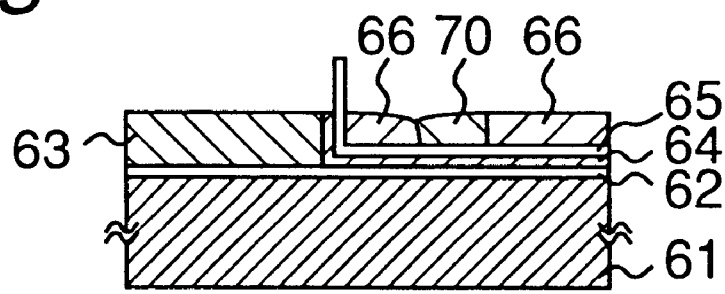
Figure 3C:
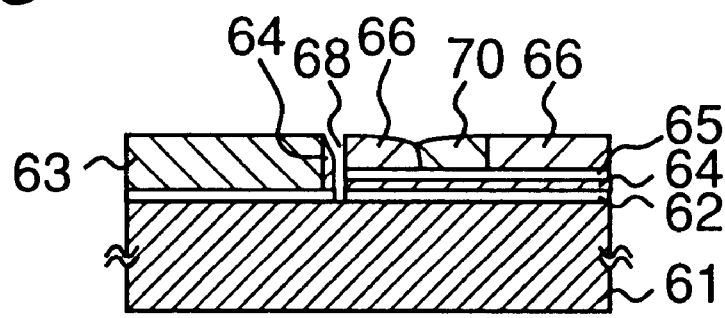

FIGS. 3A through 3C are sectional views of a substrate according to the quantum thin line producing method of the present embodiment. In the present embodiment, first, similarly to FIG. 1A through FIG. 1E of the first embodiment, a first oxide film (10 nm) 62, a first nitride film (100 nm) pattern 63, a second nitride film (10 nm) 64, a second oxide film (5 nm) 65 and a third nitride film (100 nm) 66 are formed on an Si substrate 61. Further, a photoresist pattern is formed so that the end surface thereof is positioned in the stepped portion of the third nitride film 66.

Next, similarly to FIG. 2B through FIG. 2D of the second embodiment, dry etching is performed using the photoresist pattern as a mask, and thereafter the photoresist pattern is removed. A fourth nitride film 70 is formed and thereafter etched back to expose the second oxide film 65 on the first nitride film 63.

If the fourth nitride film 70 is etched back until the second oxide film 65 on the first nitride film 63 is exposed, then, as shown in FIG. 3A, the second nitride film 64 and the second oxide film 65 are removed by wet etching. Next, as shown in FIG. 3B, the first nitride film 63, the third nitride film 66 and the fourth nitride film 70 are etched back by 60 nm to protrude the second oxide film 65 that extends in the perpendicular direction. Subsequently, as shown in FIG. 3C, a groove 68 for exposing the Si substrate 61 is formed by performing oxide film etching and nitride film etching and oxide film etching.

In this case, the aspect ratio in the etching stage is small, and therefore, the etching is made easy. Then, by performing the subsequent processes similarly to FIG. 1I through FIG. 1K, a Si quantum thin line can be formed.

Fourth Embodiment

Figure 4A:
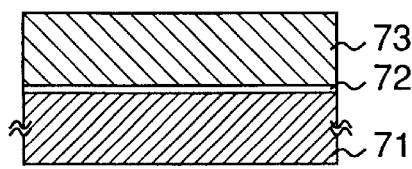
FIGS. 4A through 4K are sectional views of a substrate, showing a quantum thin line producing method different from those of FIGS. 1A–1K through FIGS. 3A–3C.

FIGS. 4A through 4K are sectional views of a substrate in the processes of the quantum thin line producing method of the present embodiment. Referring to FIGS. 4A through 4K, first, as shown in FIG. 4A, the surface of a silicon substrate 71 is oxidized to form a first oxide film 72 having a film thickness of 10 nm and then a first nitride film 73 having a film thickness of 100 nm is formed by the CVD method or the like. In this case, the first nitride film 73 has a sufficient film thickness with respect to the positional alignment accuracy in forming a photoresist pattern 76 for patterning a second nitride film 75 in the subsequent process.

Figure 4B:
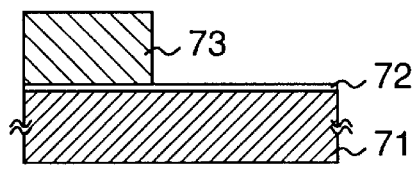
Figure 4C:
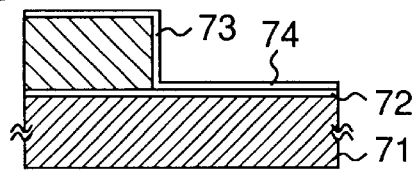
Figure 4D:
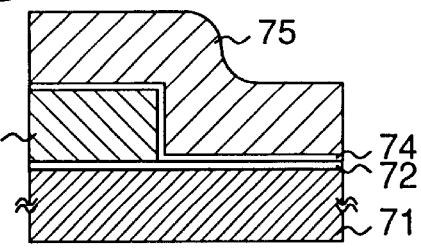

Next, as shown in FIG. 4B, the first nitride film 73 is patterned by anisotropic etching via a resist mask (not shown). Next, as shown in FIG. 4C, a second oxide film 74 having a film thickness of 10 nm is formed by the CVD method. Next, as shown in FIG. 4D, a second nitride film 75 having a film thickness of 100 nm is formed by the CVD method or the like.

Figure 4E:
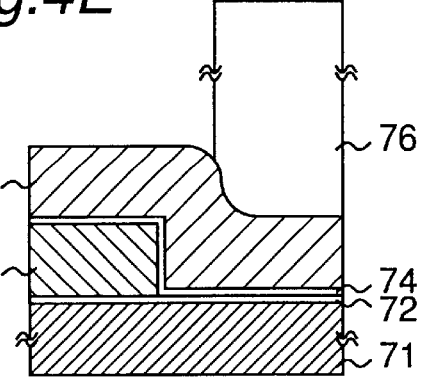

Next, as shown in FIG. 4E, a photoresist pattern 76 is formed so that the end surface thereof is positioned in the stepped portion of the second nitride film 75. In this case, as described above, the film thickness of the first nitride film 73 is set thick so as to allow the end surface of the photoresist pattern 76 to be positioned in the stepped portion of the second nitride film 75 by utilizing the positional alignment accuracy of the photoresist pattern end surface by the conventional LSI technique. Therefore, the photoresist pattern 76 can be formed by the conventional LSI exposure technique without using any special exposure technique by means of electron beam lithography, AFM or the like.

Figure 4F:
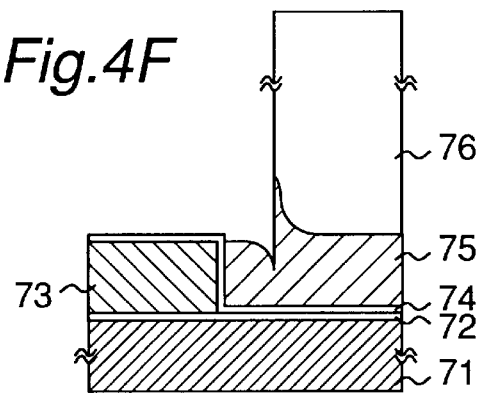

Next, as shown in FIG. 4F, the portion that belongs to the second nitride film 75 and is positioned on the first nitride film 73 is removed by anisotropic etching using the photoresist pattern 76 as a mask. In this case, the portion that belongs to the second nitride film 75 and is located below the photoresist pattern 76 is left intact without being etched, as a consequence of which the second nitride film 75 located between the photoresist pattern 76 and the first nitride film 73 comes to have a shape like a side wall. The end surface of the photoresist pattern 76 is positioned in the vicinity of the stepped portion (see FIG. 4D) of the second nitride film 75, and therefore, the most deeply etched portion of the shape like the above-mentioned side wall does not reach the second oxide film 74 located below the first nitride film 73.

Figure 4G:
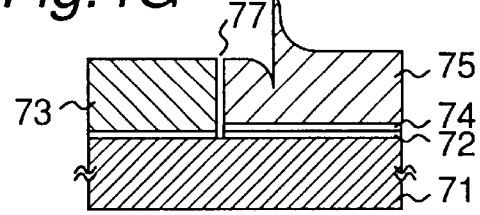
Figure 4H:
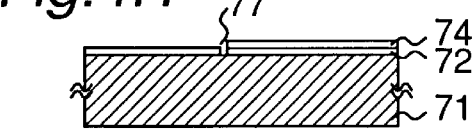

Next, as shown in FIG. 4G, the photoresist pattern 76 is removed and thereafter the oxide film is subjected to dry etching. By this dry etching, the portion that is belonging to the second oxide film 74, existing on the first nitride film 73, extending in the direction perpendicular to the silicon substrate 71 and put between first nitride film 73 and the second nitride film 75 as well as the first oxide film 72 located under the second oxide film 74 are removed. Thus, as shown in FIG. 4H, a groove 77 for exposing the Si substrate 71 is formed. That is, the width of the groove 77 is set by the film thickness (10 nm) of the second oxide film 74.

Figure 4I:
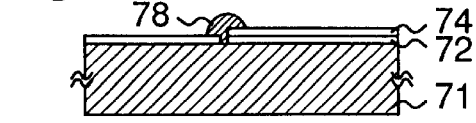

Next, as shown in FIG. 4H, the first nitride film 73 and the second nitride film 75 are removed by dry etching or wet etching. Subsequently, the entire substrate is placed in a reaction chamber equivalent to the high-vacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas will become $10^{-2}$ Torr or lower, a Si thin line 78 is made to epitaxially grow on the exposed portion of the Si substrate 71, as shown in FIG. 4I. In this case, it is required to subsequently isolate the Si thin line 78 from the Si substrate 71 by oxidation, and therefore, the Si thin line 78 is made to grow wider than the width of the groove 77. In order to eliminate the damage due to the etching of the exposed portion of the Si substrate 71 prior to the epitaxial growth of the Si thin line 78, it is acceptable to form a sacrifice oxide film on the surface of the exposed portion of the Si substrate 71 and perform wet etching for an appropriate time.

Figure 4J:
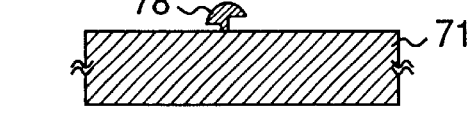
Figure 4K:

Next, as shown in FIG. 4J, the first oxide film 72 and the second oxide film 74 are removed by wet etching with hydrofluoric acid or the like. Finally, as shown in FIG. 4K, oxidation is performed to form a third oxide film 79 below the Si thin line 78 and on the surface of the Si substrate 71, and the Si thin line 78 is isolated from the Si substrate 71 by the third oxide film 79. The Si thin line 78 is thus formed.

According to the present embodiment, the second oxide film 74 relevant to the control of the width of the quantum thin line 78 is formed by the CVD method. Therefore, the film thickness accuracy is inferior to that of film thickness control for forming the second oxide film 35 by oxidizing the surface of the second nitride film 34 in the first embodiment. However, the number of times of nitride film formation is reduced by one, providing an advantage that the processes are simplified.

Fifth Embodiment

FIGS. 5A through 5E are sectional views of a substrate according to the quantum thin line producing method of the present embodiment. In the present embodiment, the positional control margin of the end surface of the photoresist pattern 76 in patterning the second nitride film 75 is made about double that of the fourth embodiment, similarly to the second embodiment.

In the present embodiment, first, similarly to FIG. 4A through FIG. 4E of the fourth embodiment, a first oxide film (10 nm) 82, a first nitride film (100 nm) pattern 83, a second oxide film (10 nm) 84 and a second nitride film (100 nm) 85 are formed on an Si substrate 81. Further, a photoresist pattern 86 is formed so that the end surface thereof is positioned in the stepped portion of the second nitride film 85. Thus, the state shown in FIG. 5A is provided.

Figure 5A:
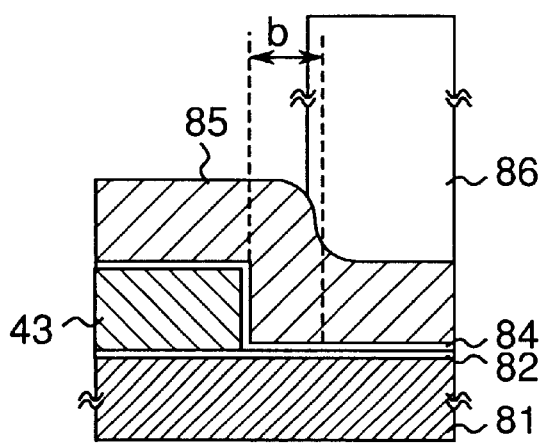
FIGS. 5A through 5E are sectional views of a substrate, showing a quantum thin line producing method different from those of FIGS. 1A–1K through FIGS. 4A–4K.
Figure 5D:
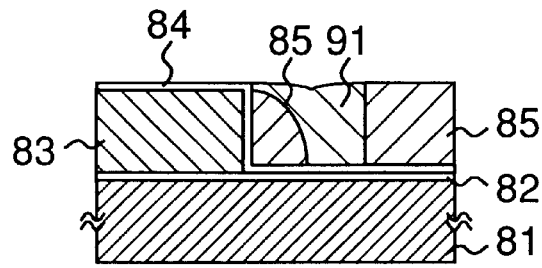
Figure 5B:
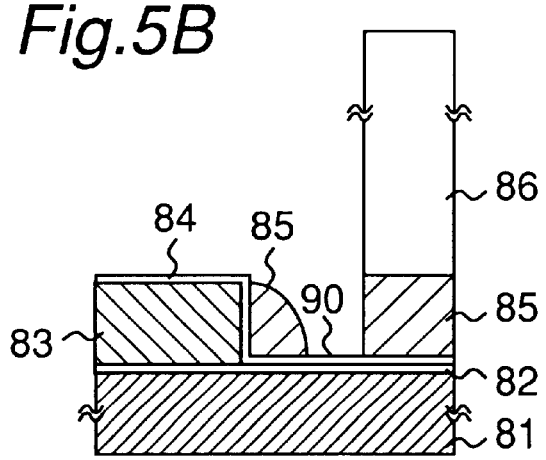

If the end surface of the photoresist pattern 86 is formed on the right-hand side of a positional control margin "b" shown in FIG. 5A and dry etching is performed for patterning the second nitride film 85 using the photoresist pattern 86 as a mask, then, as shown in FIG. 5B, the most deeply etched portion of the shape like the aforementioned side wall reaches the second oxide film 84, and a second oxide film exposed portion 90 where the second oxide film 84 is exposed is formed outside the first nitride film pattern 83. Therefore, if the processes subsequent to the process of FIG. 4G are performed strictly in accordance with the fourth embodiment, then the portion where the Si substrate 81 is exposed is disadvantageously formed in the second oxide film exposed portion 90.

Figure 5E:
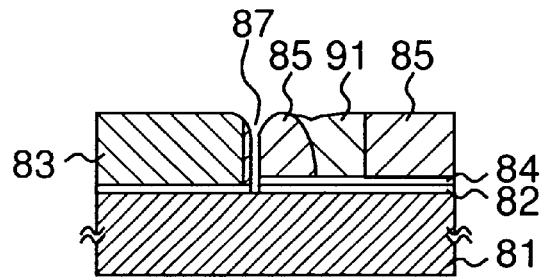
Figure 5C:
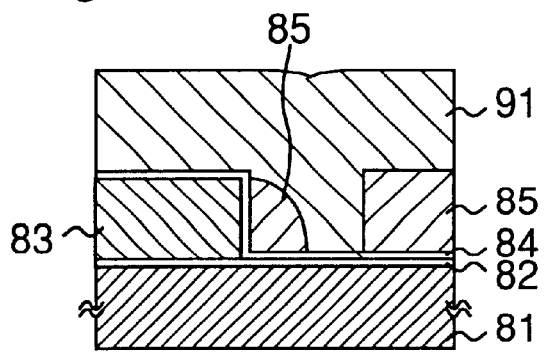

Accordingly, in the present embodiment, as shown in FIG. 5C, a third nitride film 91 having a film thickness of 100 nm is formed after the removal of the photoresist pattern 86. In this case, by appropriately changing the film thickness of the third nitride film 91 according to the width of the second oxide film exposed portion 90, the surface unevenness after the formation of the third nitride film 91 can be reduced. Next, as shown in FIG. 5D, the third nitride film 91 is etched back so that the portion that belongs to the second oxide film 84 and is located above the first nitride film 83 is exposed. Then, by performing the dry etching of the oxide film, as shown in FIG. 5E, the portion that is belonging to the second oxide film 84, existing on the first nitride film 83, extending in the direction perpendicular to the Si substrate 81 and put between the first nitride film pattern 83 and the second nitride film 85 as well as the first oxide film 82 located under the second oxide film 84 are removed. A groove 87 for exposing the Si substrate 81 is thus formed.

By performing the subsequent processes similarly to the processes of FIG. 4H through FIG. 4K, a Si quantum thin line can be formed. According to this fifth embodiment, the positional control margin "b" of the end surface of the photoresist pattern 86 can be made about double that of the fourth embodiment, allowing the workability and accuracy of positional control to be improved.

Sixth Embodiment

In the fifth embodiment, as shown in FIG. 5E, the groove 87 for exposing the Si substrate 81 is formed by performing oxide film etching. However, it is anticipated that the aspect ratio of the groove 87 for exposing the Si substrate 81 will become very large, and it can be considered very difficult to form a narrow groove 87 by etching in the above case. Accordingly, in the present embodiment, the aspect ratio of the groove to be formed for exposing the Si substrate is reduced to allow the formation of the groove by etching to be easy.

Figure 6A:
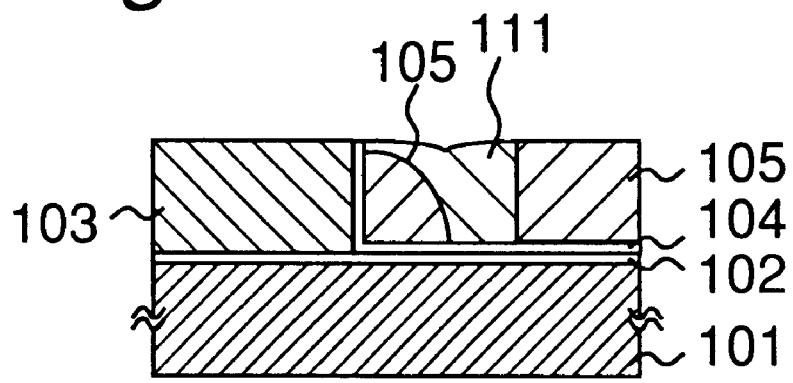
FIGS. 6A through 6C are sectional views of a substrate, showing a quantum thin line producing method different from those of FIGS. 1A–1K through FIGS. 5A–5E.
Figure 6B:
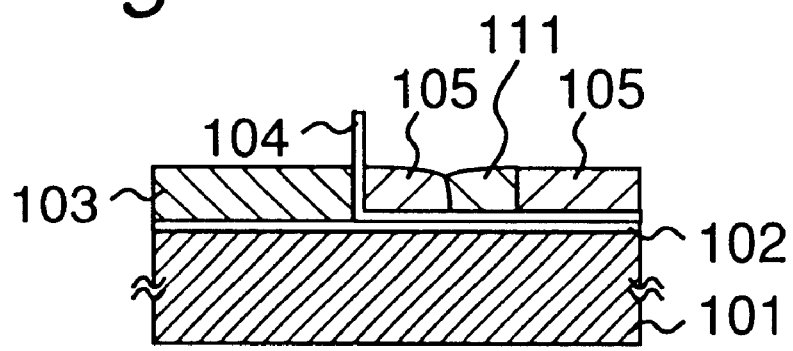
Figure 6C:
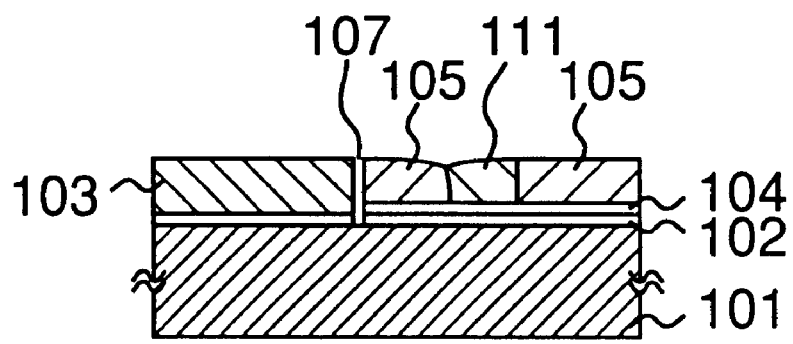

FIGS. 6A through 6C are sectional views of a substrate according to the quantum thin line producing method of the present embodiment. In the present embodiment, first, similarly to FIG. 4A through FIG. 4E of the fourth embodiment, a first oxide film 102, a first nitride film pattern 103, a second oxide film 104 and a second nitride film 105 are formed on an oxidized Si substrate 101. Further, a photoresist pattern is formed so that the end surface thereof is positioned in the stepped portion of the second nitride film 105.

Next, similarly to FIG. 5B through FIG. 5D of the fifth embodiment, dry etching is performed using the photoresist pattern as a mask, consequently forming a second oxide film exposed portion. A third nitride film 111 is formed and, by performing etching back, the second oxide film 104 on the first nitride film 103 is exposed.

If the second oxide film 104 on the first nitride film pattern 103 is thus exposed, then, as shown in FIG. 6A, the second nitride film 104 on the first nitride film 103 is removed by wet etching. Next, as shown in FIG. 6B, the first nitride film 103, the second nitride film 105 and the third nitride film 111 are etched back by 60 nm to protrude the second oxide film 104 that extends in the perpendicular direction. Subsequently, as shown in FIG. 6C, a groove 107 for exposing the Si substrate 101 is formed by performing oxide film etching.

Then, by performing the subsequent processes similarly to FIG. 4H through FIG. 4K, a Si quantum thin line can be formed. According to the present embodiment, the aspect ratio in the etching stage is small, and this allows the etching to be easy. Therefore, a groove 107 having a narrow width can be easily formed, and a thinner quantum thin line can be consequently formed.

Seventh Embodiment

The present embodiment is related to a quantum thin line producing method obtained by eliminating the formation of the photoresist pattern 37 to be used for patterning the third nitride film 36 on the first nitride film 33 in the first embodiment.

Figure 7A:
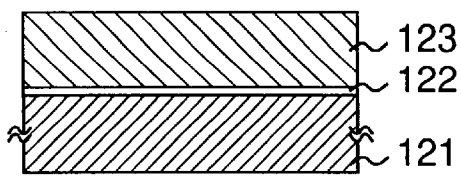
FIGS. 7A through 7J are sectional views of a substrate, showing a quantum thin line producing method different from those of FIGS. 1A–1K through FIGS. 6A–6C.

FIGS. 7A through 7J are sectional views of a substrate in the processes of the present embodiment. Referring to FIGS. 7A through 7J, first, as shown in FIG. 7A, a surface of a silicon substrate 121 is oxidized to form a first oxide film 122 having a film thickness of 10 nm, and a first nitride film 123 having a film thickness of 50 nm is subsequently formed by the CVD method or the like.

Figure 7B:
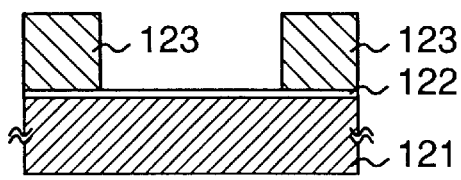
Figure 7C:
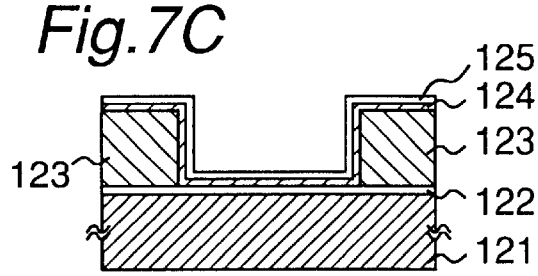
Figure 7D:
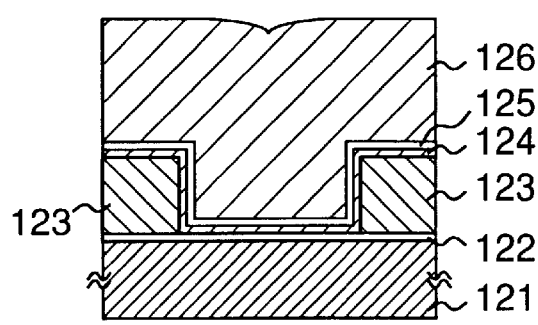

Next, as shown in FIG. 7B, the first nitride film 123 is patterned by anisotropic etching via a resist mask (not shown). Next, as shown in FIG. 7C, a second nitride film 124 having a film thickness of 10 nm is formed by the CVD method or the like. Next, the surface of the second nitride film 124 is oxidized to form a second oxide film 125 having a film thickness of 5 nm. The film thickness of 5 nm of the second oxide film 125 becomes the width of a groove to be subsequently formed. Next, as shown in FIG. 7D, a third nitride film 126 is formed by the CVD method or the like. In this case, the third nitride film 126 is made to have a film thickness such that a stepped portion generated by the patterning of the first nitride film 123 disappears. For example, assuming that an interval between adjacent patterns of the first nitride film 123 is 0.2 μm, then the film thickness of the third nitride film 126 is made not smaller than three fourths of the interval, i.e., not smaller than 0.15 μm.

Figure 7E:
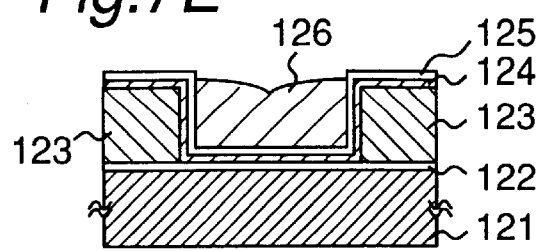
Figure 7F:
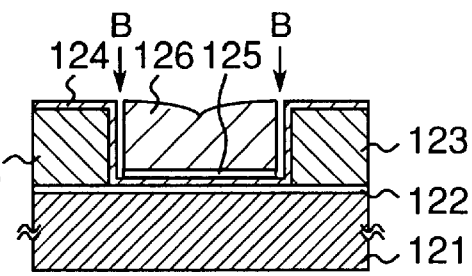
Figure 7G:
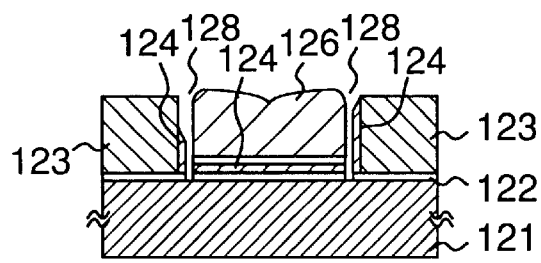

Next, as shown in FIG. 7E, the third nitride film 126 is etched back to expose the second oxide film 125 on the first nitride film 123. Next, as shown in FIG. 7F, etching of the oxide film is performed. By this etching, the portion that is belonging to the second oxide film 125, existing on the first nitride film 123, extending in the direction perpendicular to the silicon substrate 121 and put between the second nitride film 124 and the third nitride film 126 are removed. Next, as shown in FIG. 7G, by etching the second nitride film 124 located below a groove B formed by removing the second oxide film 125 that extends in the perpendicular direction by the etching of the oxide film in FIG. 1F as well as the first oxide film 122 located under the second nitride film, a groove 128 for exposing the silicon substrate 121 is formed.

Figure 7H:
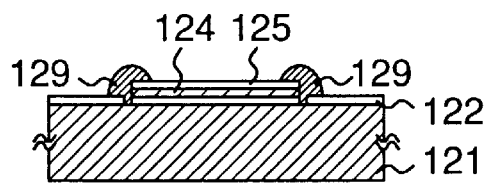

Next, as shown in FIG. 7H, the first nitride film 123, the second nitride film 124 extending in the perpendicular direction and the third nitride film 126 are removed by dry etching or wet etching. Subsequently, the entire substrate is placed in a reaction chamber equivalent to the high-vacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas will become $10^{-2}$ Torr or lower, a Si thin line 129 is made to epitaxially grow on the exposed portion of the Si substrate 121. In this case, it is required to subsequently isolate the Si thin line 129 from the Si substrate 121 by oxidation, and therefore, the Si thin line 129 is made to grow wider than the width of the groove 128. In order to eliminate the damage due to the etching of the exposed portion of the Si substrate 121 prior to the epitaxial growth of the Si thin line 129, it is acceptable to form a sacrifice oxide film on the surface of the exposed portion of the Si substrate 121 and perform wet etching for an appropriate time.

Figure 7I:
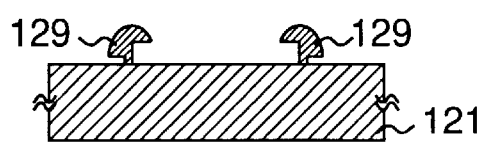
Figure 7J:
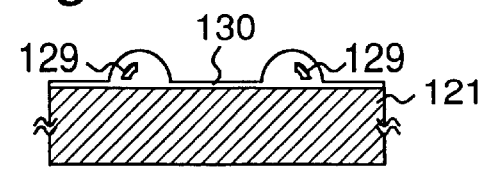

Next, as shown in FIG. 7I, the first oxide film 122, the second nitride film 124 and the second oxide film 125 are removed by wet etching with hydrofluoric acid, phosphoric acid or the like. Finally, as shown in FIG. 7J, oxidation is performed to form a third oxide film 130 below the Si thin line 129 and on the surface of the Si substrate 121, isolating the quantum thin line 129 from the Si substrate 121 by the third oxide film 130. The Si quantum thin line 129 is thus formed.

According to the present embodiment, the process of forming the photoresist pattern (corresponding to the photoresist pattern 37 in the first embodiment) for patterning the third nitride film 126 is not needed, by comparison with the first embodiment. Therefore, the processes can be further simplified to allow the cost reduction to be achieved by comparison with the first embodiment.

Eighth Embodiment

Figure 8A:
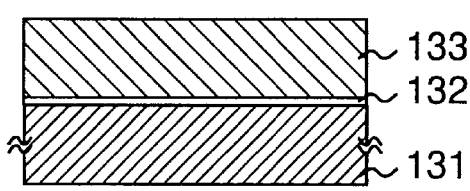
FIGS. 8A through 8J are sectional views of a substrate, showing a quantum thin line producing method different from those of FIGS. 1A–1K through FIGS. 7A–7J.

FIGS. 8A through 8J are sectional views of a substrate in the processes of the quantum thin line producing method of the present embodiment. Referring to FIGS. 8A through 8J, first, as shown in FIG. 8A, a first oxide film 132 having a film thickness of 10 nm is formed by oxidizing the surface of a silicon substrate 131, and subsequently a first nitride film 133 having a film thickness of 50 nm is formed by the CVD method or the like.

Figure 8B:
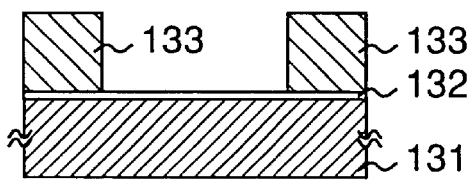
Figure 8C:
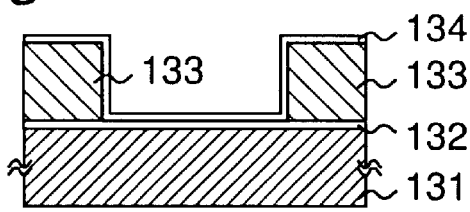
Figure 8D:
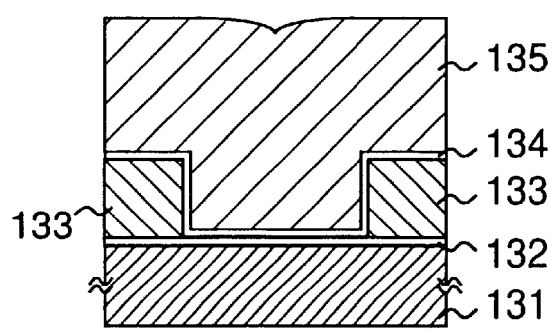

Next, as shown in FIG. 8B, the first nitride film 133 is patterned by anisotropic etching via a resist mask (not shown). Next, as shown in FIG. 8C, a second oxide film 134 having a film thickness of 10 nm is formed by the CVD method or the like. Next, as shown in FIG. 8D, the second nitride film 135 is formed by the CVD method or the like. In this case, the second nitride film 135 is made to have a film thickness such that a stepped portion generated by the patterning of the first nitride film 133 disappears. For example, assuming that an interval between adjacent patterns of the first nitride film 133 is 0.2 μm, then the film thickness of the second nitride film 135 is made not smaller than three fourths of the interval, i.e., not smaller than 0.15 μm.

Figure 8E:
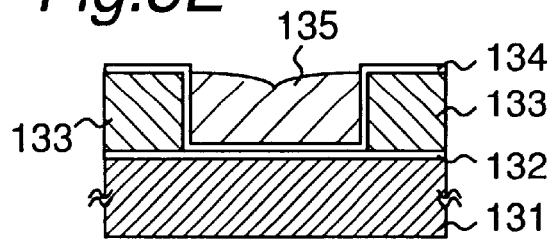
Figure 8F:
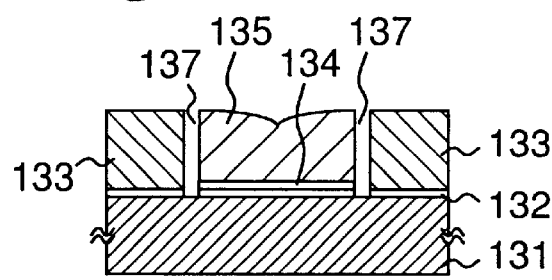

Next, as shown in FIG. 8E, the second nitride film 135 is etched back to expose the second oxide film 134 on the first nitride film 133. Next, as shown in FIG. 8F, etching of the oxide film is performed. By this etching, the portion that is belonging to the second oxide film 134, existing on the first nitride film 133, extending in the direction perpendicular to the Si substrate 131 and put between the first nitride film 133 and the second nitride film 135 as well as the first oxide film 132 located under the second oxide film 134 are removed. A groove 137 for exposing the Si substrate 131 is thus formed.

Figure 8G:
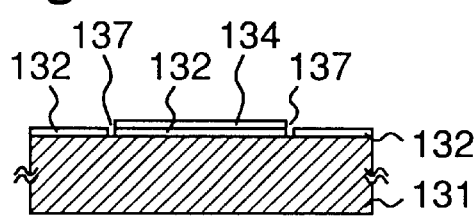
Figure 8H:
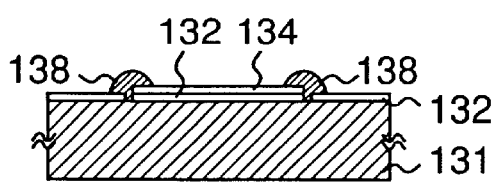

Next, as shown in FIG. 8G, the first nitride film 133 and the second nitride film 135 are removed by dry etching or wet etching. Subsequently, the entire substrate is placed in a reaction chamber equivalent to the highvacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas will become $10^{-2}$ Torr or lower, a Si thin line 138 is made to epitaxially grow on the exposed portion of the Si substrate 131, as shown in FIG. 8H. In order to eliminate the damage due to the etching of the exposed portion of the Si substrate 131 prior to the epitaxial growth of the Si thin line 138, it is acceptable to form a sacrifice oxide film on the surface of the exposed portion of the Si substrate 131 and perform wet etching for an appropriate time.

Figure 8I:
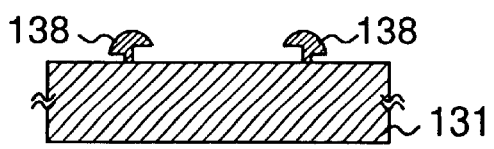
Figure 8J:
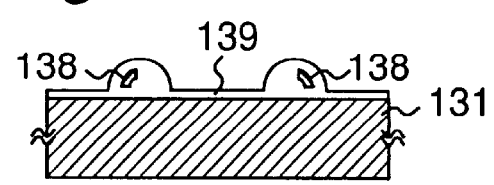

Next, as shown in FIG. 8I, the first oxide film 132 and the second oxide film 134 are removed by wet etching with hydrofluoric or the like. Finally, as shown in FIG. 8J, oxidation is performed to form a third oxide film 139 below the Si thin line 138 and on the surface of the Si substrate 131. The quantum thin line 138 is isolated from the Si substrate 131 by the third oxide film 139. The Si quantum thin line 138 is thus formed.

According to the present embodiment, the second oxide film 134 relevant to the control of the width of the quantum thin line 138 is formed by the CVD method. Therefore, the film thickness accuracy is inferior to that of film thickness control for forming the second oxide film 125 by oxidizing the surface of the second nitride film 124 in the seventh embodiment. However, the number of times of nitride film formation is reduced by one, providing an advantage that the processes are simplified. Furthermore, the process of forming the photoresist pattern (corresponding to the photoresist pattern 76 in the fourth embodiment) for patterning the second nitride film 135 is not needed, by comparison with the fourth embodiment. Therefore, the processes can be simplified to allow the cost reduction to be achieved by comparison with the fourth embodiment.

Ninth Embodiment

Figure 9A:
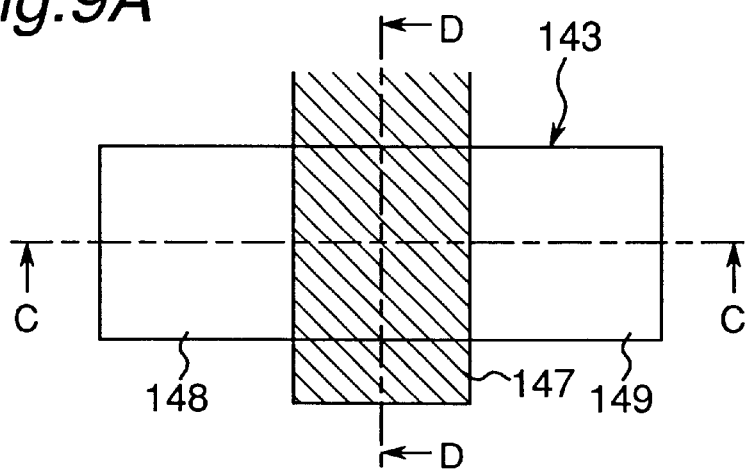
FIGS. 9A through 9C are views showing a non-volatile memory that serves as a semiconductor device of the present invention.
Figure 9B:
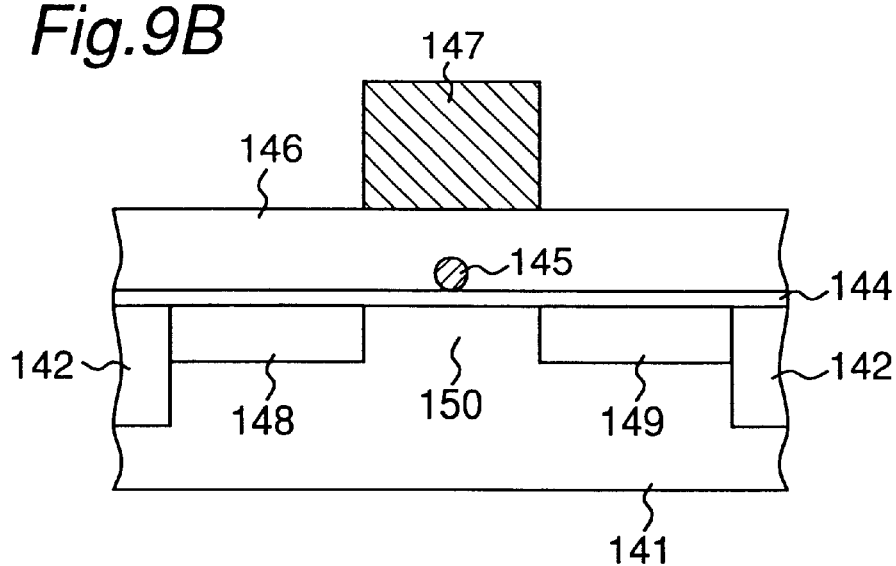

The present embodiment is related to a semiconductor device employing the quantum thin line formed according to any one of the first through eighth embodiments. FIG. 9A is a plan view of a non-volatile memory (flash EEPROM (electrically erasable programmable read only memory) or the like) that serves as the above-mentioned semiconductor device. FIG. 9B is a sectional view taken along the line indicated by arrow C—C in FIG. 9A.

As shown in FIG. 9A and FIG. 9B, according to the present non-volatile memory, a rectangular region 143 surrounded by an element isolation region 142 is formed on a silicon substrate 141. Then, roughly at the center of the region 143, a nanometer-size quantum thin line 145 is formed in the direction roughly perpendicular to the lengthwise direction of the region 143 according to any one of the first through eighth embodiments. Then, the third oxide film formed on the silicon substrate 141 is made to serve as a tunnel oxide film 144, while the quantum thin line 145 is made to serve as a floating gate region. Subsequently, a control gate insulating film 146 having a film thickness of 10 nm is formed on the tunnel oxide film 144 and the quantum thin line 145 by the CVD method. Next, a gate electrode 147 is formed on the control gate insulating film 146, and thereafter a source region 148 and a drain region 149 are formed by implanting impurity ions using the gate electrode 147 as a mask. A channel region 150 is formed between the source region 148 and the drain region 149. A non-volatile memory is thus provided with a structure in which the floating gate region located between the channel region 150 and the gate electrode 147 is constructed of the quantum thin line 145.

Figure 9C:
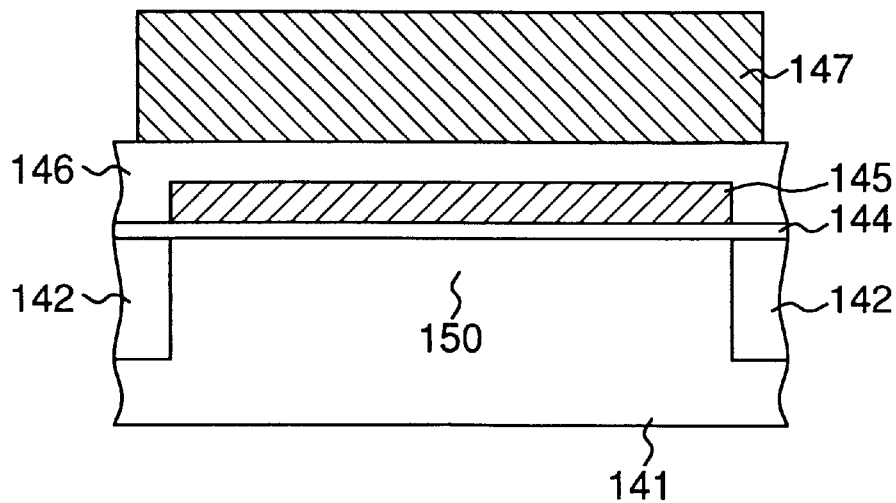

FIG. 9C is a sectional view taken along the line indicated by arrow D—D in FIG. 9A. In the present embodiment, the quantum thin line 145 is arranged so as to roughly perpendicularly cross the source region 148 and the drain region 149 shown in FIG. 9A. Therefore, by using the quantum thin line 145 as the floating gate region, electric charge accumulation in the floating gate region can be reduced. Therefore, a non-volatile memory that has a very small consumption of power, a super-high density and a large capacity can be provided.

That is, according to the present embodiment, the quantum thin line 145 can be formed by means of the general film forming technique, lithographic technique and etching technique. Therefore, a non-volatile memory of a high yield and high productivity appropriate for mass production can be provided at low cost. It is to be noted that the quantum thin line 145 is not limited to silicon and is allowed to be another semiconductor material or metal material.

Tenth Embodiment

Figure 10A:
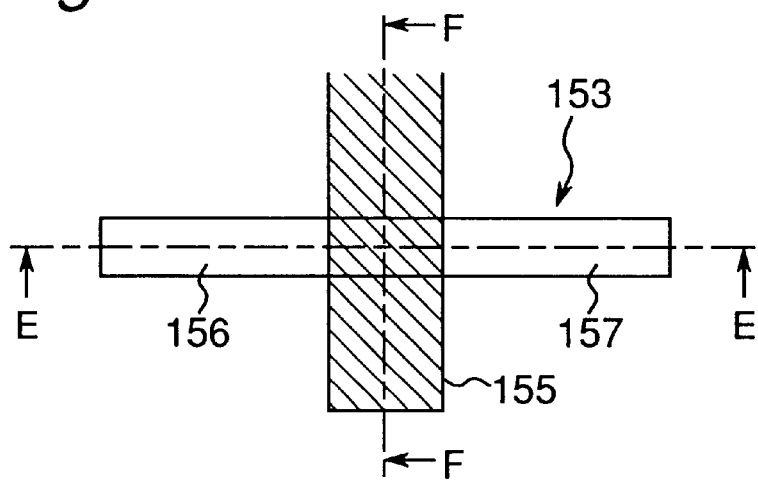
FIGS. 10A through 10C are views showing a MOSFET that serves as a semiconductor device different from that of FIGS. 9A–9C.
Figure 10B:
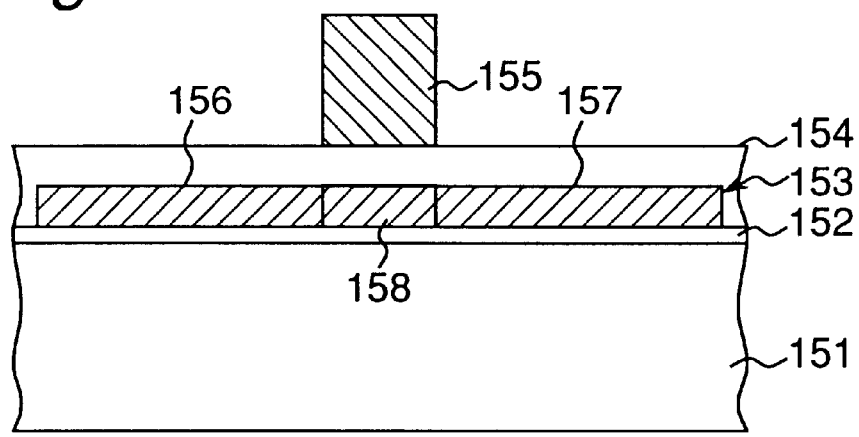
Figure 10C:
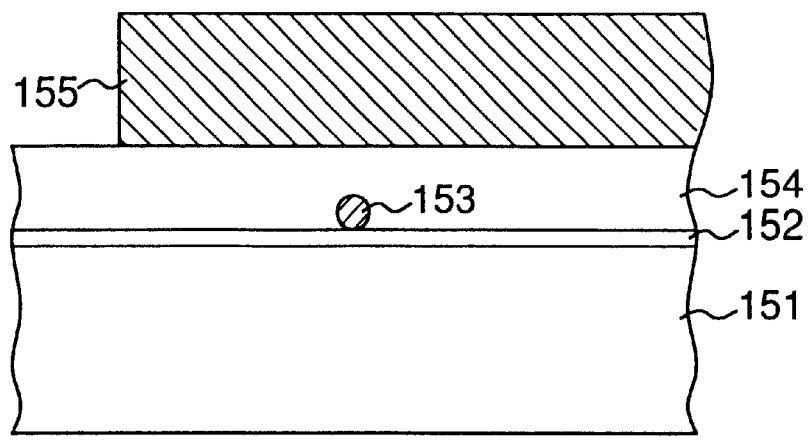

FIG. 10A is a plan view of a MOSFET that serves as the aforementioned semiconductor device. FIG. 10B is a sectional view taken along the line indicated by arrow E—E in FIG. 10A. FIG. 10C is a sectional view taken along the line indicated by arrow F—F in FIG. 10A.

As. shown in FIG. 10A through FIG. 10C, in the MOSFET of the present embodiment, an insulating layer (aforementioned third oxide film) 152 and a quantum thin line 153 are formed on a silicon substrate 151 according to any one of the first through eighth embodiments. Subsequently, a gate insulating film 154 having a film thickness of 30 nm is formed on the insulating layer 152 and the quantum thin line 153 by the CVD method. Then, a gate electrode 155 is formed on the gate insulating film 154 and thereafter the impurity ions are implanted using the gate electrode 155 as a mask, consequently forming a source region 156 and a drain region 157 in the quantum thin line 153. In this case, a space located between the source region 156 and the drain region 157 within the quantum thin line 153 becomes a channel region 158.

In the above construction, it is possible to make the quantum thin line 153 have a width of not greater than 10 nm by means of the general film forming technique, lithographic technique and etching technique. Therefore, the channel region 158 can be quantized in the direction of the quantum thin line 153, attaining linear conduction. That is, according to the present embodiment, a super-high speed MOSFET of a high yield and high productivity appropriate for mass production can be provided at low cost.

Eleventh Embodiment

Figure 11:
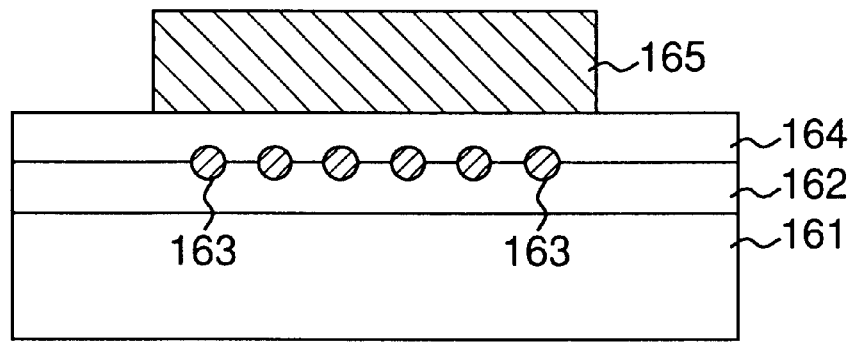
FIG. 11 is a view showing a light-emitting device that serves as a semiconductor device different from those of FIGS. 9A–9C and FIGS. 10A–10C.

FIG. 11 shows the cross section of a light-emitting device that serves as the aforementioned semiconductor device. In the light-emitting device shown in FIG. 11, an insulating layer (aforementioned third oxide film) 162 and a plurality of quantum thin lines 163 having a diameter of not greater than 10 nm are formed on a silicon substrate 161 according to any one of the first through eighth embodiments. Then, a gate insulating film 164 having a film thickness of 30 nm is formed on the insulating layer 162 and the quantum thin lines 163 by the CVD method. Further, a transparent gate electrode 165 is formed of ITO (indium tin oxide) or the like on the gate insulating film 164.

In the above construction, each of the quantum thin lines 163 has a diameter of not greater than 10 nm, and therefore, a direct transition type band structure is provided by the quantum confining effect. Then, by applying a voltage across the gate electrode 165 and a silicon substrate 161, a tunnel current flows between the insulating film 162 and the gate insulating film 164. By the tunnel current, electrons are injected into the quantum thin lines 163, as a consequence of which electronic transition occurs in the quantum thin lines 163, causing light emission. That is, according to the present embodiment, a high-efficiency light-emitting device that has a sharp spectrum even with a small current and excellent high-frequency characteristics can be obtained.

In the above case, the quantum thin lines 163 are formed by the general film forming technique, lithographic technique and etching technique. Therefore, a light-emitting device of a high yield and high productivity appropriate for mass production can be provided at low cost.

Twelfth Embodiment

Figure 12A:
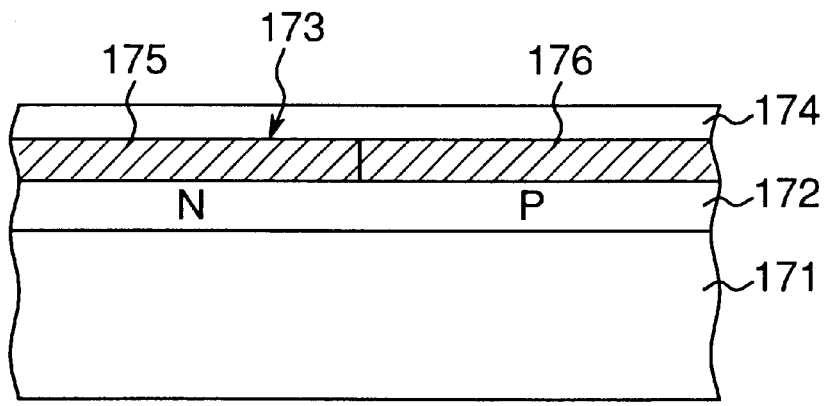
FIGS. 12A and 12B are views showing a light-emitting device that serves as a semiconductor device different from those of FIGS. 9A–9C through FIG. 11 and the band structure of the device.

FIG. 12A shows the cross section of a light-emitting device that serves as the aforementioned semiconductor device. In the light-emitting device shown in FIG. 12A, an insulating layer (aforementioned third oxide film) 172 and a plurality of quantum thin lines 173 having a diameter of not greater than several tens of nanometers are formed on a silicon substrate 171 according to any one of the first through eighth embodiments. Then, an insulating film 174 having a film thickness of 30 nm is formed on the insulating layer 172 and the quantum thin lines 173 by the CVD method. Further, an n-type impurity region 175 is formed by implanting n-type impurity ions into part of the quantum thin line 173 by means of a photoresist mask (not shown). Likewise, a p-type impurity region 176 is formed by implanting p-type impurity ions into the region that belongs to the quantum thin lines 173 and is other than the n-type impurity region 175.

Figure 12B:
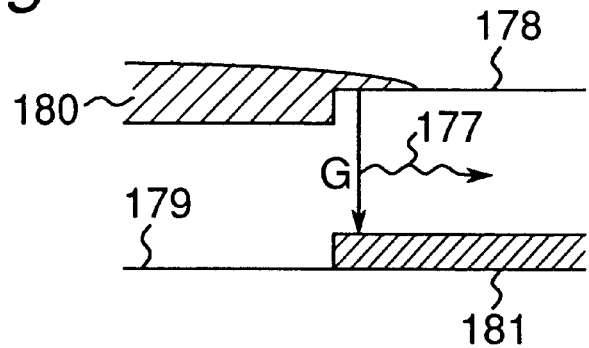

In the above construction, the diameter of the quantum thin line 173 is not greater than several tens of nanometers, and therefore, a direct transition type band structure is provided by the quantum confining effect. Then, a pn junction is formed in the boundary region located between the n-type impurity region 175 and the p-type impurity region 176. Therefore, a pn junction band structure as shown in FIG. 12B is formed. By applying a voltage across the n-type impurity region 175 and the p-type impurity region 176, reunion of an electron 180 with a hole 181 occurs in the pn junction region as indicated by arrow (G), consequently emitting light 177. It is to be noted that the reference numeral 178 denotes a conduction band and the reference numeral 179 denotes a valence band in FIG. 12B.

In the above case, the quantum thin line 173 is formed of silicon by the general film forming technique, lithographic technique and etching technique. Therefore, a light-emitting device of a high yield and high productivity appropriate for mass production can be provided at low cost.

Thirteenth Embodiment

Figure 13A:
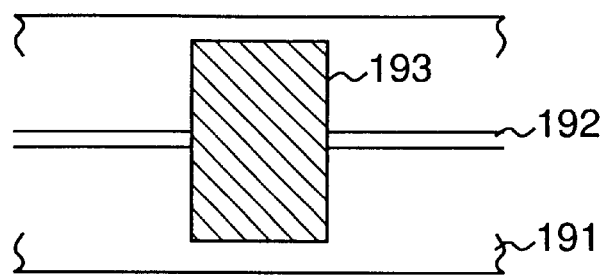
FIGS. 13A through 13E are views showing a procedure for forming a light-emitting device that serves as a semiconductor device different from those of FIGS. 9A–9C through FIGS. 12A and 12B.

FIGS. 13A through 13E are plan views showing a procedure for forming a light-emitting device that serves as the aforementioned semiconductor device. Referring to FIGS. 13A through 13E, first, as shown in FIG. 13A, a groove 192 for exposing a Si substrate 191 is formed on the Si substrate 191 while being put between an oxide film and a laminate body of an oxide film and a nitride film as shown in FIG. 4H through the processes described in connection with any one of the first through eighth embodiments. In this case, the portion that belongs to the surface of the substrate 191 and is other than the groove 192 is covered with an insulating layer. Then, the Si substrate 191 including part of the groove 192 is covered with a first nitride film 193.

Figure 13B:
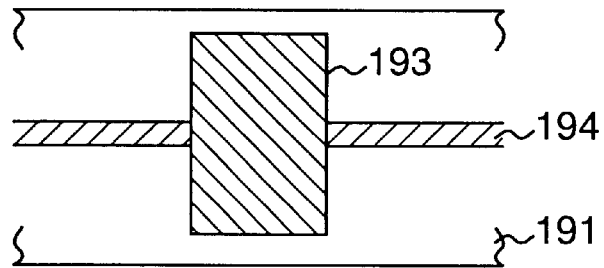
Figure 13C:
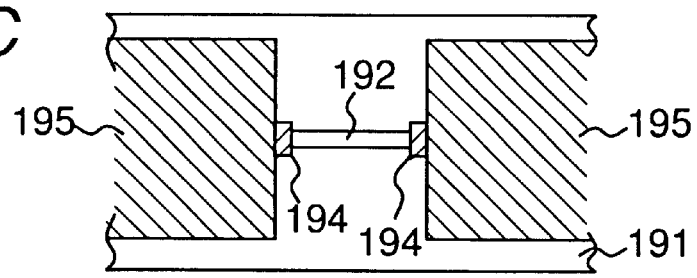

Next, as shown in FIG. 13B, an Si thin line 194 is made to grow in the portion of the groove 192 that is not covered with the first nitride film 193 through the quantum thin line growth process described in connection with any one of the first through eighth embodiments. Next, as shown in FIG. 13C, the first nitride film 193 is removed to expose the portion that belongs to the groove 192 and has been covered with the first nitride film 193, while a second nitride film 195 is formed so as to cover the portion of the Si thin line 194.

Figure 13D:
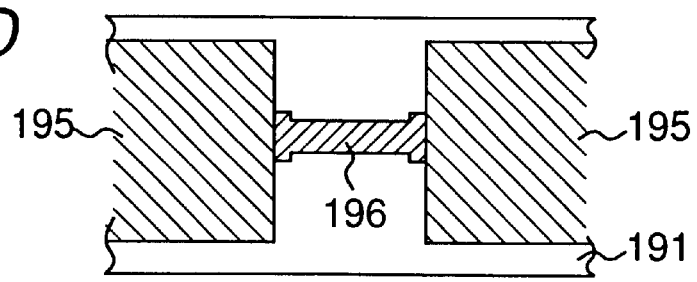
Figure 13E:
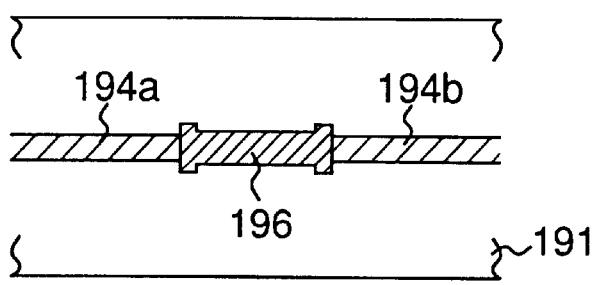

Next, as shown in FIG. 13D, a SiGe thin line 196 is made to grow in the portion that belongs to the groove 192 and is not covered with the second nitride film 195 using monosilane ($SiH_4$) and monogermane ($GeH_4$) as material gases by the quantum thin line growth process described in connection with any one of the first through eighth embodiments. Next, as shown in FIG. 13E, the second nitride film 195 is removed, and thereafter appropriate ions are implanted into the SiGe thin line 196, a Si thin line 194a located on the left-hand side of the SiGe thin line 196 in the figure and a Si thin line 194b located on the right-hand side of the SiGe thin line 196 in the figure. The present light-emitting device is thus obtained.

Figure 14:
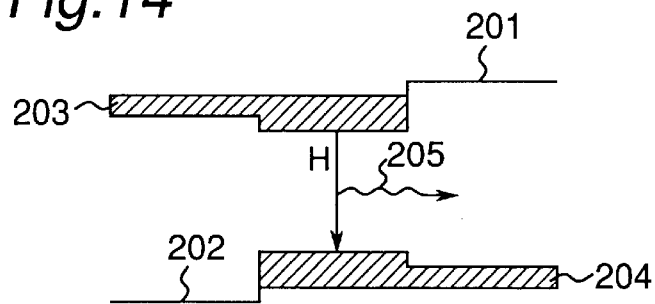
FIG. 14 is a view showing the band structure of the light-emitting device shown in FIGS. 13A–13E.
Figure 15A:
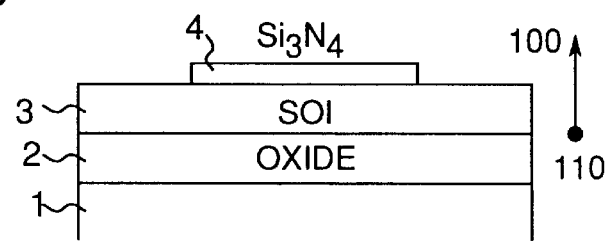
FIGS. 15A through 15D are process charts showing a Si quantum thin line producing method utilizing the conventional anisotropic etching.
Figure 15B:
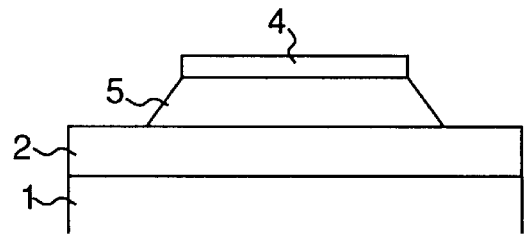
Figure 15C:
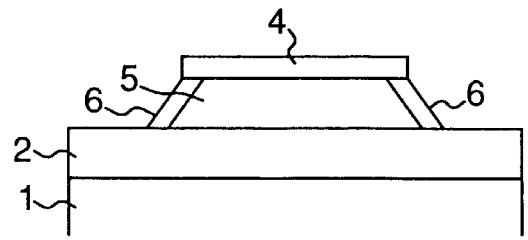
Figure 15D:
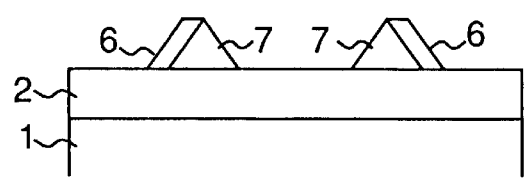
Figure 16A:
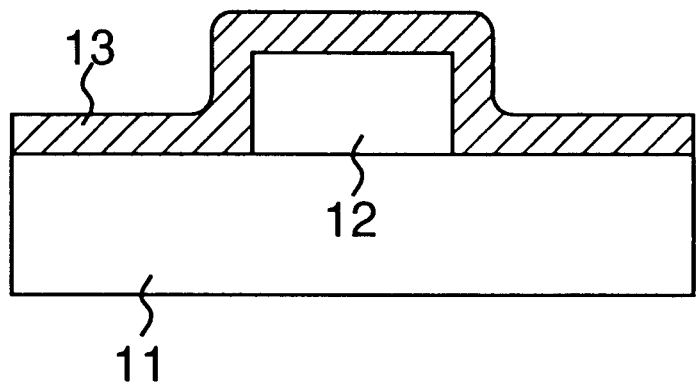
FIGS. 16A through 16C are process charts showing a quantum thin line producing method utilizing a mask formed by the conventional side wall method.
Figure 16B:
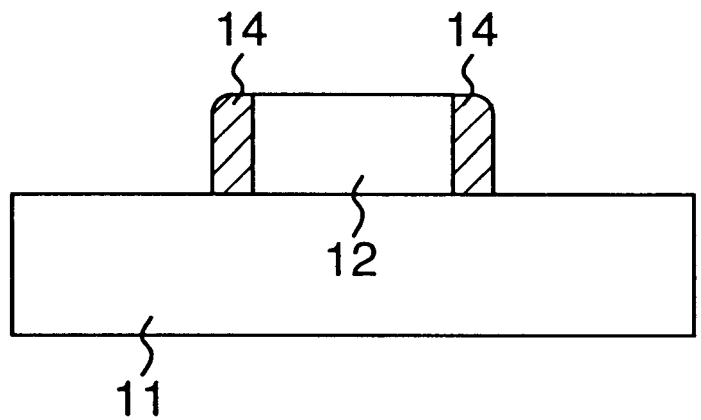
Figure 16C:
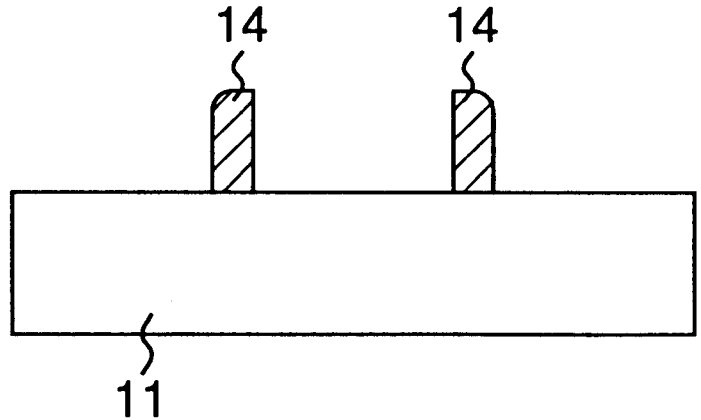
Figure 17A:
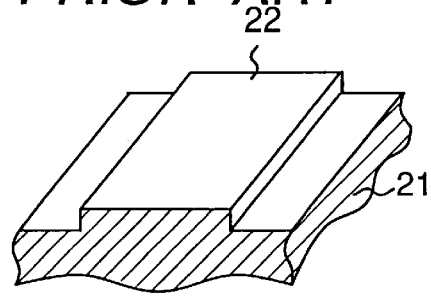
FIGS. 17A through 17G are process charts showing the conventional quantum thin line forming method for sticking two Si wafers on each other.
Figure 17B:
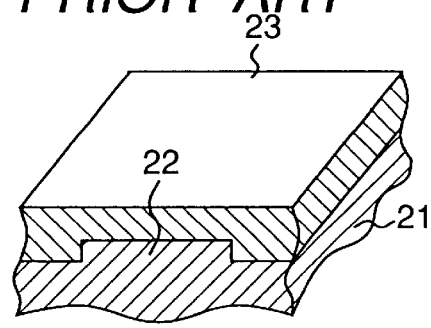
Figure 17C:
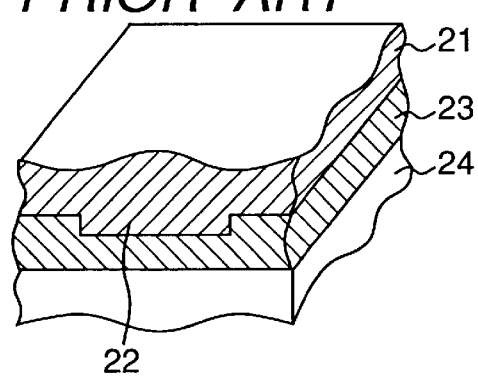
Figure 17D:
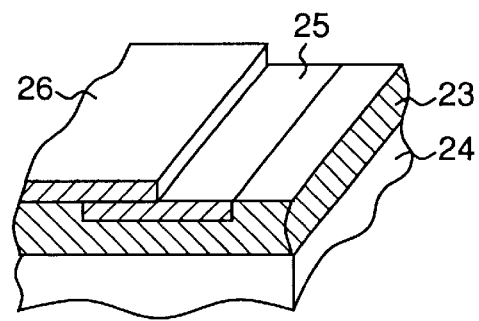
Figure 17E:
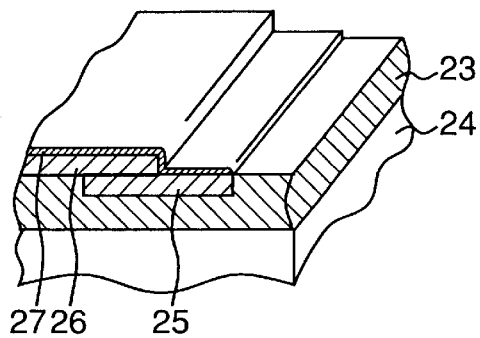
Figure 17F:
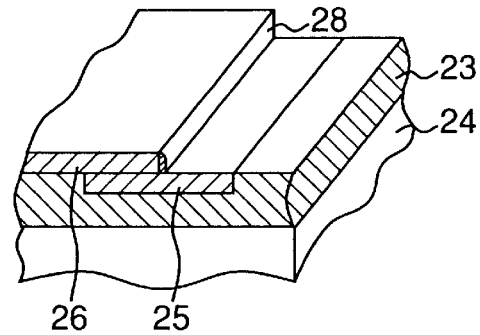
Figure 17G:
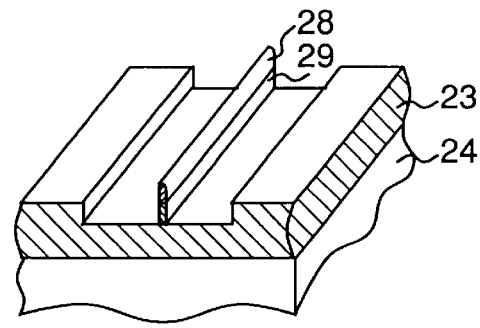

FIG. 14 shows the band structure of the light-emitting device having the aforementioned construction. The aforementioned SiGe, having a smaller band gap than Si, has a double hetero structure, in which an electron 203 and a hole 204 are concentrated on the SiGe thin line 196. Therefore, reunion of the electron 203 with the hole 204 indicated by arrow (H) is efficiently effected, consequently emitting light 205. It is to be noted that the reference numeral 201 denotes a conduction band and the reference numeral 202 denotes a valence band in FIG. 14.

In the above case, the Si thin line 194 and the SiGe thin line 196 are formed of Si or SiGe by the general film forming technique, lithographic technique and etching technique. Therefore, a light-emitting device of a high yield and high productivity appropriate for mass production can be provided at low cost.

Although the Si substrate is employed as a semiconductor substrate in the first through thirteenth embodiments, the substrate is allowed to be made of a semiconductor material other than Si. Although disilane ($Si_2H_6$) is employed as a material gas in forming the quantum thin line of silicon, it is acceptable to use any one of monosilane ($SiH_4$), trisilane ($Si_3H_8$), dichlorosilane ($SiH_2Cl_2$) and tetrachlorosilane ($SiCl_4$). When the quantum thin line is formed of germanium, it is proper to use any one of monogermane ($GeH_4$), digermane ($Ge_2H_6$) and germanium tetrafluoride ($GeF_4$) as a material gas. When the quantum thin line is formed of silicon germanium, it is proper to use a mixed gas constructed of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas. When the quantum thin line is formed of aluminum, it is proper to use an organic aluminum of DMAH (($CH_3)_2AlH$) or the like as a material.

Furthermore, the material of the quantum thin line is limited neither to the semiconductor of silicon, germanium or silicon germanium nor to the metal of aluminum. The present invention, capable of forming a superfine thin line of a conductive material without using any special fine processing apparatus, can also be applied to the wiring of a high-density LSI. The semiconductor device having a quantum thin line that becomes the basis of a quantum effect device and a single electron device and is produced according to the present invention can be mounted on the same substrate as that of a Si-based LSI. By applying this semiconductor device to a light-emitting device or a photoelectric transducing device, an electronic circuit and an optical communication circuit can be combined with each other.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A quantum thin line producing method comprising:
    a process for forming a first oxide film on a semiconductor substrate and forming a patterned first nitride film on the first oxide film;
    a process for forming a second nitride film on the first oxide film and the patterned first nitride film and forming a second oxide film by oxidizing a surface of the second nitride film;
    a process for forming a third nitride film on the second oxide film;
    a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film;
    a process for removing by dry etching the second oxide film that extends in a direction perpendicular to an upper surface of the semiconductor substrate and is put between the second nitride film and the third nitride film using the second nitride film and the third nitride film as a mask, consequently forming a groove;

a process for removing by etching the second nitride film located under the groove and the first oxide film located under the second nitride film, consequently exposing the semiconductor substrate;

a process for removing the first nitride film together with the second nitride film and the third nitride film facing the groove;

a process for epitaxially growing a quantum thin line on the exposed portion of the semiconductor substrate;

a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

2. A quantum thin line producing method comprising:

a process for forming a first oxide film on a semiconductor substrate and forming a patterned first nitride film on the first oxide film;

a process for forming a second nitride film on the first oxide film and the patterned first nitride film and forming a second oxide film by oxidizing a surface of the second nitride film;

a process for forming a third nitride film on the second oxide film;

a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film;

a process for forming a fourth nitride film;

a process for etching back the fourth nitride film, consequently exposing a portion that belongs to the second oxide film and is located above the first nitride film;

a process for removing by dry etching the second oxide film that extends in a direction perpendicular to an upper surface of the semiconductor substrate and is put between the second nitride film and the third nitride film using the second nitride film, the third nitride film and the fourth nitride film as a mask, consequently forming a groove;

a process for removing by etching the second nitride film located under the groove and the first oxide film located under the second nitride film, consequently exposing the semiconductor substrate;

a process for removing the first nitride film together with the second nitride film, the third nitride film and the fourth nitride film facing the groove;

a process for epitaxially growing a quantum thin line on the exposed portion of the semiconductor substrate;

a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

3. A quantum thin line producing method comprising:

a process for forming a first oxide film on a semiconductor substrate and forming a patterned first nitride film on the first oxide film;

a process for forming a second nitride film on the first oxide film and the patterned first nitride film and forming a second oxide film by oxidizing a surface of the second nitride film;

a process for forming a third nitride film on the second oxide film;

a process for masking a portion that belongs to the third nitride film and extends from a center portion to a lower portion of a stepped portion based on an end portion of the first nitride film and etching back an upper portion of the stepped portion, consequently exposing a portion that belongs to the second oxide film and is located above the first nitride film;

a process for forming a fourth nitride film;

a process for etching back the fourth nitride film, consequently exposing a portion that belongs to the second oxide film and is located above the first nitride film;

a process for removing the second oxide film and the second nitride film located above the first nitride film;

a process for reducing by etching back the first nitride film, the third nitride film and the fourth nitride film in film thickness and lowering in height the second nitride film that extends in the direction perpendicular to an upper surface of the semiconductor substrate;

a process for removing by dry etching the second oxide film that extends in a direction perpendicular to the upper surface of the semiconductor substrate and is put between the second nitride film and the third nitride film using the second nitride film, the third nitride film and the fourth nitride film as a mask, consequently forming a groove;

a process for removing by etching the second nitride film located under the groove and the first oxide film located under the second nitride film, consequently exposing the semiconductor substrate;

a process for removing the first nitride film together with the second nitride film, the third nitride film and the fourth nitride film facing the groove;

a process for epitaxially growing a quantum thin line on the exposed portion of the semiconductor substrate;

a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

4. A quantum thin line producing method comprising:

a process for forming a first oxide film on a semiconductor substrate and forming a patterned first nitride film on the first oxide film;

a process for forming a second oxide film on the first oxide film and the patterned first nitride film;

a process for forming a second nitride film on the second oxide film;

a process for masking a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film;

a process for removing by dry etching the second oxide film that extends in a direction perpendicular to an upper surface of the semiconductor substrate and is put between the first nitride film and the second nitride film together with the first oxide film located under the second oxide film using the first nitride film and the second nitride film as a mask, consequently forming a groove for exposing the semiconductor substrate;

a process for removing the first nitride film and the second nitride film;

a process for epitaxially growing a quantum thin line on the exposed portion of the semiconductor substrate;

a process for removing the first oxide film and the second oxide film; and a process for forming a third oxide film by oxidizing a lower portion of the quantum thin line, consequently isolating the quantum thin line from the semiconductor substrate by the t oxide film.

5. A quantum thin line producing method comprising:

a process for forming a first oxide film on a semiconductor substrate and forming a patterned first nitride film on the first oxide film;

a process for forming a second oxide film on the first oxide film and the patterned first nitride film;

a process for forming a second nitride film on the second oxide film;

a process for masking a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film;

a process for forming a third nitride film;

a process for etching back the third nitride film, consequently exposing a portion that belongs to the second oxide film and is located above the first nitride film;

a process for removing by dry etching the second oxide film that extends in a direction perpendicular to an upper surface of the semiconductor substrate and is put between the first nitride film and the second nitride film together with the first oxide film located under the second oxide film using the first nitride film, the second nitride film and the third nitride film as a mask, consequently forming a groove for exposing the semiconductor substrate;

a process for removing the first nitride film, the second nitride film and the third nitride film;

a process for epitaxially growing a quantum thin line on the exposed portion of the semiconductor substrate;

a process for removing the first oxide film and the second oxide film; and a process for forming a third oxide film by oxidizing a lower portion of the quantum thin line, consequently isolating the quantum thin line from the semiconductor substrate by the third oxide film.

6. A quantum thin line producing method comprising:

a process for forming a first oxide film on a semiconductor substrate and forming a patterned first nitride film on the first oxide film;

a process for forming a second oxide film on the first oxide film and the patterned first nitride film;

a process for forming a second oxide film on the second oxide film;

a process for masking a portion that belongs to the second nitride film and extends from a center portion to a lower portion of a stepped portion based on an end portion of the first nitride film and etching back an upper portion of the stepped portion, consequently exposing a portion that belongs to the second oxide film and is located above the first nitride film;

a process for forming a third nitride film;

a process for etching back the third nitride film, consequently exposing a portion that belongs to the second oxide film and is located above the first nitride film;

a process for removing the second oxide film located above the first nitride film;

a process for reducing the first nitride film, the second nitride film and the third nitride film in film thickness;

a process for removing by dry etching the second oxide film that extends in a direction perpendicular to an upper surface of the semiconductor substrate and is put between the first nitride film and the second nitride film together with the first oxide film located under the second oxide film using the first nitride film, the second nitride film and the third nitride film as a mask, consequently forming a groove for exposing the semiconductor substrate;

a process for removing the first nitride film, the second nitride film and the third nitride film;

a process for epitaxially, growing a quantum thin line on the exposed portion of the semiconductor substrate;

a process for removing the first oxide film and the second oxide film; and a process for forming a third oxide film by oxidizing a lower portion of the quantum thin line, consequently isolating the quantum thin line from the semiconductor substrate by the third oxide film.

7. A quantum thin line producing method comprising:

a process for forming a first oxide film on a semiconductor substrate and forming a patterned first nitride film on the first oxide film;

a process for forming a second nitride film on the first oxide film and the patterned first nitride film and forming a second oxide film by oxidizing a surface of the second nitride film;

a process for forming a third nitride film on the second oxide film, consequently burying a recess portion located between portions of the first nitride film;

a process for etching back the third nitride film, consequently exposing a portion that belongs to the second oxide film and is located above the first nitride film;

a process for removing by etching the second oxide film that extends in a direction perpendicular to an upper surface of the semiconductor substrate and is put between the second nitride film and the third nitride film using the second nitride film and the third nitride film as a mask, consequently forming a groove;

a process for removing by etching the second nitride film located under the groove and the first oxide film located under the second nitride film, consequently exposing the semiconductor substrate;

a process for removing the first nitride film together with the second nitride film and the third nitride film facing the groove;

a process for epitaxially growing a quantum thin line on the exposed portion of the semiconductor substrate;

a process for removing the first oxide film, the second nitride film and the second oxide film; and a process for forming a third oxide film by oxidizing a lower portion of the quantum thin line, consequently isolating the quantum thin line from the semiconductor substrate by the third oxide film.

8. A quantum thin line producing method comprising:

a process for forming a first oxide film on a semiconductor substrate and forming a patterned first nitride film on the first oxide film;

a process for forming a second oxide film on the first oxide film and the patterned first nitride film;

a process for forming a second nitride film on the second oxide film, consequently burying a recess portion located between portions of the first nitride film;

a process for etching back the second nitride film, consequently exposing a portion that belongs to the second oxide film and is located above the first nitride film;

a process for removing by etching the second oxide film that extends in a direction perpendicular to an upper surface of the semiconductor substrate and is put between the first nitride film and the second nitride film together with the first oxide film located under the second oxide film using the first nitride film and the second nitride film as a mask, consequently forming a groove for exposing the semiconductor substrate;

a process for removing first nitride film and the second nitride film;

a process for epitaxially growing a quantum thin line on the exposed portion of the semiconductor substrate;

a process for removing the first oxide film and the second oxide film; and a process for forming a third oxide film by oxidizing a lower portion of the quantum thin line, consequently isolating the quantum thin line from the semiconductor substrate by the third oxide film.

9. A quantum thin line producing method as claimed in claim 1, wherein the process for epitaxially growing the quantum thin line comprises the steps of:

introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

10. A quantum thin line producing method as claimed in claim 9, wherein a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

11. A quantum thin line producing method as claimed in claim 9, wherein a germanium thin line is formed as the quantum thin line using any one of monogermane ($GeH_4$), digermane ($Ge_2H_6$) and germanium tetrafluoride ($GeF_4$) as a material gas.

12. A quantum thin line producing method as claimed in claim 9, wherein a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

13. A quantum thin line producing method as claimed in claim 9, wherein an aluminum thin line is formed as the quantum thin line using an organic aluminum.

14. A quantum thin line producing method as claimed in claim 2, wherein the process for epitaxially growing the quantum thin line comprises the steps of:

introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

15. A quantum thin line producing method as claimed in claim 14, wherein a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

16. A quantum thin line producing method as claimed in claim 14, wherein a germanium thin line is formed as the quantum thin line using any one of monogermane ($GeH_4$), digermane ($Ge_2H_6$) and germanium tetrafluoride ($GeF_4$) as a material gas.

17. A quantum thin line producing method as claimed in claim 14, wherein a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

18. A quantum thin line producing method as claimed in claim 14, wherein an aluminum thin line is formed as the quantum thin line using an organic aluminum.

19. A quantum thin line producing method as claimed in claim 3, wherein the process for epitaxially growing the quantum thin line comprises the steps of:

introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

20. A quantum thin line producing method as claimed in claim 19, wherein a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

21. A quantum thin line producing method as claimed in claim 19, wherein a germanium thin line is formed as the quantum thin line using any one of monogermane ($GeH_4$), digermane ($Ge_2H_6$) and germanium tetrafluoride ($GeF_4$) as a material gas.

22. A quantum thin line producing method as claimed in claim 19, wherein
a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

23. A quantum thin line producing method as claimed in claim 19, wherein
an aluminum thin line is formed as the quantum thin line using an organic aluminum.

24. A quantum thin line producing method as claimed in claim 4, wherein
the process for epitaxially growing the quantum thin line comprises the steps of:
introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter
flowing a material gas into the reaction chamber so as to perform vapor growth of the quantum thin line under a material gas partial pressure of not higher than $10^{-2}$ Torr.

25. A quantum thin line producing method as claimed in claim 24, wherein
a silicon thin line is formed as the quantum thin line using any one of monosilane ($SiH_4$), disilane ($Si_2H_6$), trisilane ($Si_3H_8$), dichlorosilane ($SiH_2C_2$) and tetrachlorosilane ($SiCl_4$) as a material gas.

26. A quantum thin line producing method as claimed in claim 24, wherein
a germanium thin line is formed as the quantum thin line using any one of monogermane ($GeH_4$), digermane ($Ge_2H_6$) and germanium tetrafluoride ($GeF_4$) as a material gas.

27. A quantum thin line producing method as claimed in claim 24, wherein
a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

28. A quantum thin line producing method as claimed in claim 24, wherein
an aluminum thin line is formed as the quantum thin line using an organic aluminum.

29. A quantum thin line producing method as claimed in claim 5, wherein
the process for epitaxially growing the quantum thin line comprises the steps of:
introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter
flowing a material gas into the reaction chamber so as to perform vapor growth of the quantum thin line under a material gas partial pressure of not higher than $10^{-2}$ Torr.

30. A quantum thin line producing method as claimed in claim 29, wherein
a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

31. A quantum thin line producing method as claimed in claim 29, wherein
a germanium thin line is formed as the quantum thin line using any one of monogermane ($GeH_4$), digermane ($Ge_2H_6$) and germanium tetrafluoride ($GeF_4$) as a material gas.

32. A quantum thin line producing method as claimed in claim 29, wherein
a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

33. A quantum thin line producing method as claimed in claim 29, wherein
an aluminum thin line is formed as the quantum thin line using an organic aluminum.

34. A quantum thin line producing method as claimed in claim 6, wherein
the process for epitaxially growing the quantum thin line comprises the steps of:
introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter
flowing a material gas into the reaction chamber so as to perform vapor growth of the quantum thin line under a material gas partial pressure of not higher than $10^{-2}$ Torr.

35. A quantum thin line producing method as claimed in claim 34, wherein
a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

36. A quantum thin line producing method as claimed in claim 34, wherein
a germanium thin line is formed as the quantum thin line using any one of monogermane ($GeH_4$), digermane ($Ge_2H_6$) and germanium tetrafluoride ($GeF_4$) as a material gas.

37. A quantum thin line producing method as claimed in claim 34, wherein
a silicon germanium thin line is formed as the quantum thin line using a mixed gas comprised of anyone of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

38. A quantum thin line producing method as claimed in claim 34, wherein
an aluminum thin line is formed as the quantum thin line using an organic aluminum.

39. A quantum thin line producing method as claimed in claim 7, wherein the process for epitaxially growing the quantum thin line comprises the steps of:

introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

40. A quantum thin line producing method as claimed in claim 39, wherein a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

41. A quantum thin line producing method as claimed in claim 39, wherein a germanium thin line is formed as the quantum thin line using any one of monogermane ($GeH_4$), digermane ($Ge_2H_6$) and germanium tetrafluoride ($GeF_4$) as a material gas.

42. A quantum thin line producing method as claimed in claim 39, wherein a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

43. A quantum thin line producing method as claimed in claim 39, wherein an aluminum thin line is formed as the quantum thin line using an organic aluminum.

44. A quantum thin line producing method as claimed in claim 8, wherein the process for epitaxially growing the quantum thin line comprises the steps of:

introducing the semiconductor substrate on which the groove for exposing the semiconductor is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

45. A quantum thin line producing method as claimed in claim 44, wherein a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

46. A quantum thin line producing method as claimed in claim 44, wherein a germanium thin line is formed as the quantum thin line using any one of monogermane ($GeH_4$), digermane ($Ge_2H_6$) and germanium tetrafluoride ($GeF_4$) as a material gas.

47. A quantum thin line producing method as claimed in claim 44, wherein a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

48. A quantum thin line producing method as claimed in claim 44, wherein an aluminum thin line is formed as the quantum thin line using an organic aluminum.

\* \* \* \* \*